United States Patent
Javidi et al.

(10) Patent No.: US 11,619,963 B2
(45) Date of Patent: Apr. 4, 2023

(54) AREA-EFFICIENT SCALABLE MEMORY READ-DATA MULTIPLEXING AND LATCHING

(71) Applicant: Intel Corporation, Santa Clara, CA (US)

(72) Inventors: Amir Javidi, Hillsboro, OR (US); Daniel Cummings, Austin, TX (US); Glenn Starnes, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 17/338,550

(22) Filed: Jun. 3, 2021

(65) Prior Publication Data
US 2021/0294374 A1    Sep. 23, 2021

Related U.S. Application Data

(63) Continuation of application No. 16/386,070, filed on Apr. 16, 2019, now Pat. No. 11,029,720.

(51) Int. Cl.
*G06F 1/06* (2006.01)
*G11C 7/10* (2006.01)
*G06F 1/3206* (2019.01)

(52) U.S. Cl.
CPC .............. *G06F 1/06* (2013.01); *G06F 1/3206* (2013.01); *G11C 7/1039* (2013.01); *G11C 7/1075* (2013.01)

(58) Field of Classification Search
CPC ........ G06F 1/06; G06F 1/3206; G06F 1/3275; G06F 1/324; G11C 11/419; G11C 7/1048; G11C 7/1039; G11C 7/1075
See application file for complete search history.

(56) References Cited

U.S. PATENT DOCUMENTS

| | | | | |
|---|---|---|---|---|
| 5,353,251 A | * | 10/1994 | Uratani | G11C 11/419 365/189.05 |
| 9,208,860 B2 | * | 12/2015 | Ngo | G11C 11/4074 |
| 9,691,499 B1 | * | 6/2017 | Dozaka | G11C 13/0061 |
| 2006/0002714 A1 | * | 1/2006 | Gill | H04B 10/2572 398/147 |
| 2006/0239068 A1 | * | 10/2006 | Boemler | G11C 8/16 365/185.01 |

(Continued)

OTHER PUBLICATIONS

Notice of Allowance dated Jan. 27, 2021 for U.S. Appl. No. 16/386,070.

*Primary Examiner* — Raymond N Phan
(74) *Attorney, Agent, or Firm* — Schwabe, Williamson & Wyatt, P.C.

(57) ABSTRACT

Described is apparatus comprising a first circuitry, a second circuitry, and a third circuitry. The first circuitry may have an output coupled to a shared-read-data signal path, and the first circuitry either driving its output to a value based on a sensed memory bit, or not driving its output. The second circuitry may have a first clocked inverter and a second clocked inverter cross-coupled with the first clocked inverter, an input of the first clocked inverter being coupled to the shared-read-data signal path, and an output of the first clocked inverter being coupled to an inverse-data signal path. The third circuitry may have an inverter with an input coupled to the inverse-data signal path and an output coupled to a data signal path.

19 Claims, 20 Drawing Sheets

(56) References Cited

U.S. PATENT DOCUMENTS

2016/0133569 A1 5/2016 Song et al.
2018/0053536 A1 2/2018 Weier
2018/0122458 A1 5/2018 Ichii
2019/0189200 A1 6/2019 Yeh et al.

\* cited by examiner

1300

AREA-EFFICIENT SCALABLE MEMORY READ-DATA MULTIPLEXING AND LATCHING

CLAIM FOR PRIORITY

This application is a continuation of, and claims the benefit of priority to U.S. patent application Ser. No. 16/386,070, filed on Apr. 16, 2019, titled "Area-Efficient Scalable Memory Read-Data Multiplexing and Latching", and which is incorporated by reference in entirety.

BACKGROUND

Static Random Access Memory (SRAM) arrays may have a variety of topologies. Some topologies may employ single blocks of memory, while other topologies may employ multiple blocks of memory. Multi-block topologies may have an Input/Output (IO) circuitry to receive sensed bits and propagate sensed data to output ports. For some multi-block topologies, that IO circuitry may be in the midst of the memory blocks, while for other multi-block topologies, that IO circuitry may be to one side of the memory blocks. Moreover, various designs may be targeted to employ "firewall" features to disable portions of the SRAM array topology to reduce power consumption.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1:
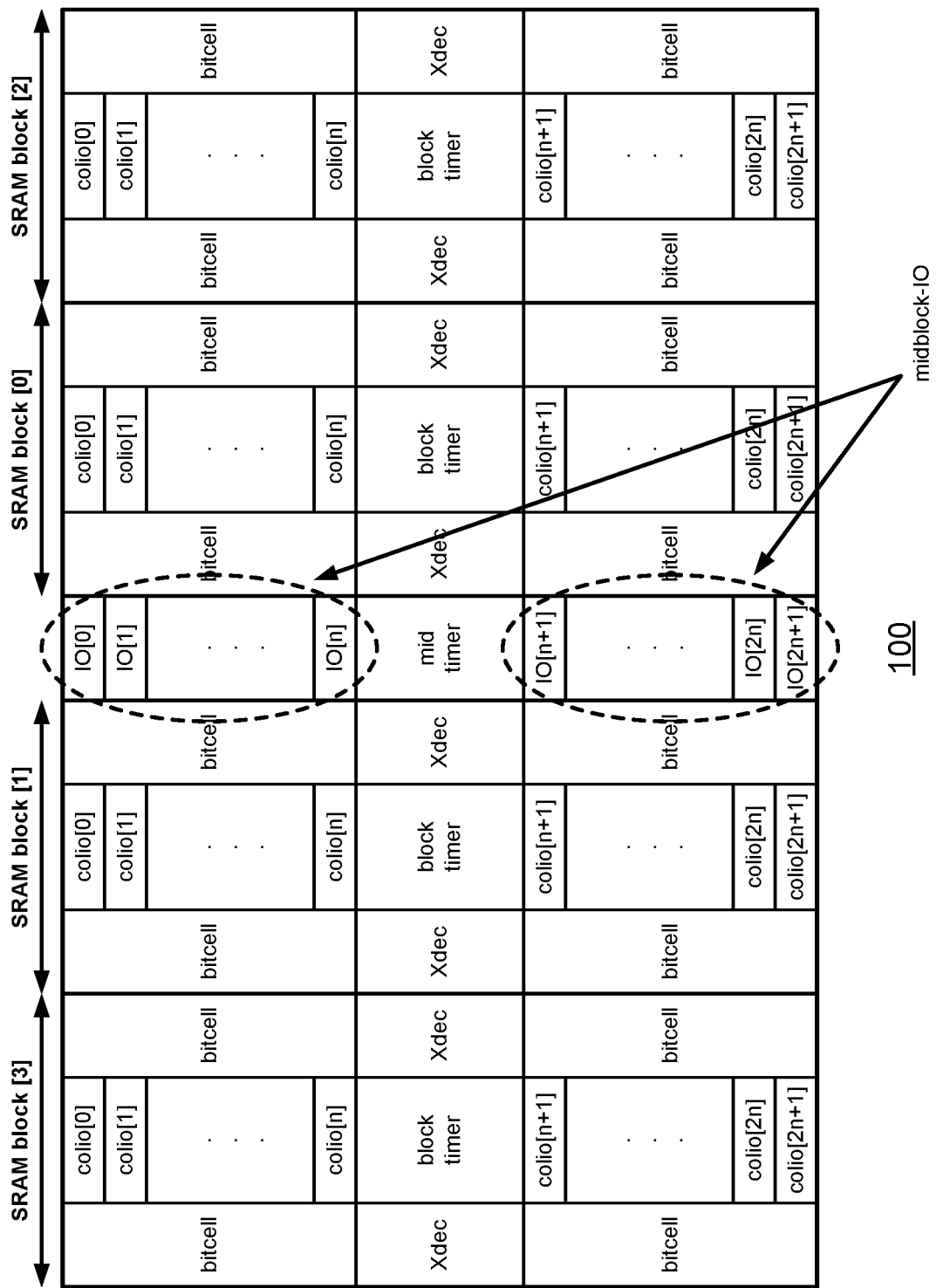
FIG. 1 illustrates a multi-block Static Random Access Memory (SRAM) array topology, in accordance with some embodiments of the disclosure.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Some embodiments disclosed herein may pertain to mechanisms and methods for implementing multiplexing and latching of output read-data in an SRAM array. With respect to such embodiments, a multi-block topology may be used to achieve better overall "power, performance, and area" (PPA) characteristics of large Static Random Access Memory (SRAM) arrays. As discussed herein, in a multi-block topology, multiple autonomous SRAM blocks may be arrayed together with a single shared central control block. Since it may be the case that one SRAM block is accessed at a time, the multiplexing and latching of read-data from the accessed block may introduce additional logic gates on the read path that may be detrimental to the performance of the array and may hurt its power and area efficiency.

Some previous approaches toward multiplexing and latching read-data may incorporate a full X-to-1 multiplexor in a shared central control block (e.g., a midblock) of a multi-block SRAM array. Such embodiments may incorporate multiplexor-select controls that are clocked. Such embodiments may have an area overhead and/or power overhead of a latch and one wire track per SRAM block. Finally, such embodiments may employ 7 logic gates from a read-data sense amplifier to an output (e.g., "Q").

Other previous approaches toward multiplexing and latching read-data may incorporate a shared jam latch or Set-Reset (SR) latch combined with a multiplexor in a midblock of a multi-block SRAM array. Such embodiments may either disconnect or discontinue pre-charging for SRAM blocks that are not being accessed, which may add enabling complexity and/or clocking complexity, as well as additional area overhead and/or power overhead in each SRAM block. Such embodiments may also use two wire tracks per side and may have undesirable data-to-out speed. Moreover, jam latch implementations may introduce device sizing complexity across process skew corners. Finally, such embodiments may employ 6 logic gates from a sense amplifier to an output.

In addition, either of these previous approaches may introduce additional macro-cells (e.g., unique building blocks) and clock-to-output delay ($t_{CQ}$), which may further impact performance.

Disclosed herein are mechanisms and methods for implementing compiler-friendly, high-speed, power-efficient, area-efficient multiplexing and latching of output read-data in a multi-block SRAM array. A first aspect of the mechanisms and methods may pertain to a 2-to-1 multiplexor and an interruptible latch in a midblock to select and latch read-data from one or more SRAM blocks (e.g., on the left side and/or right side of the midblock). A second aspect of the mechanisms and methods may pertain to a complementary tristatable driver in one or more SRAM blocks that drives read-data to the midblock via a single shared net.

A higher-speed $t_{CQ}$ path may be achieved as a result of having only one additional logic gate on the speed-path (e.g., a 2-to-1 multiplexor) in comparison with non-multi-block SRAM arrays. A pre-charging of the shared net is not required, and a shared net on an opposite side of an accessed SRAM block may be equalized automatically to the read data as soon upon the data's arrival in the midblock. Different column Input/Output (IO) multiplexor configurations (which may be termed "colIO" or "col-IO" herein) may be assembled without any modification in the circuitry by merely repeating the basic building blocks in the SRAM blocks, making this approach advantageously both scalable and compiler-friendly.

Accordingly, various advantages may accrue to SRAM array designs incorporating the mechanisms and methods disclosed herein. Performance of $t_{CQ}$ may advantageously be improved by minimizing a number of logic gates on an output path (e.g., by about 50% to 60%) and/or by reducing or eliminating contention in the circuitry. Performance of $t_{CQ}$ may advantageously be improved by starting the equalization operation as soon as data arrival in the midblock instead of waiting for the end of operation.

Dynamic power may advantageously be improved by reducing or eliminating the pre-charging of shared nets and/or by equalizing an opposite side's shared net merely when new read-data is different from previous read-data. (If an SRAM array is single-sided, equalization may be eliminated, which may save even more power.) Dynamic power may also advantageously be improved by reducing or preventing read-data glitches on outputs of SRAM arrays.

Static power may advantageously be improved by enabling SRAM blocks to be fully powered-down during a sleep mode without any interruption to output data after a wake-up. Area, clocking complexity, and/or enabling complexity may also be advantageously improved by reducing or eliminating extra pre-charge circuitry and/or enabling circuitry in SRAM blocks.

Construction of a wide variety of col-IO multiplexor configurations (lowest to highest) may advantageously be enabled as a result of using merely a single shared net to connect a midblock to SRAM blocks on either side. In addition, since merely one track may be used, full shielding may advantageously be made easier, which may in turn improve speed and/or reliability. Design effort and/or validation effort may also advantageously be reduced by minimizing the number of unique circuit blocks used to build a wide range of compiler configurations and/or features. Advantageously, taking advantage of repeatable logic blocks may advantageously make such designs more scalable and compiler-friendly.

FIG. 1 illustrates a multi-block SRAM array topology, in accordance with some embodiments of the disclosure. A topology 100 may comprise a plurality of SRAM blocks and a shared control block (e.g., in a central portion, or midblock, of the design). Topology 100 may be used in long-range SRAM compilers to improve PPA characteristics of large SRAMs. The mechanisms and methods disclosed herein may advantageously enable efficient multiplexing and latching of read-data from merely one SRAM block while reducing or eliminating detrimental impacts to PPA characteristics.

Various embodiments of the mechanisms and methods disclosed herein may pertain to col-IO circuitries and/or midblock IO circuitries, which when combined together may facilitate and/or enable the multiplexing and latching of output read-data from one or more SRAM blocks.

Figure 2:
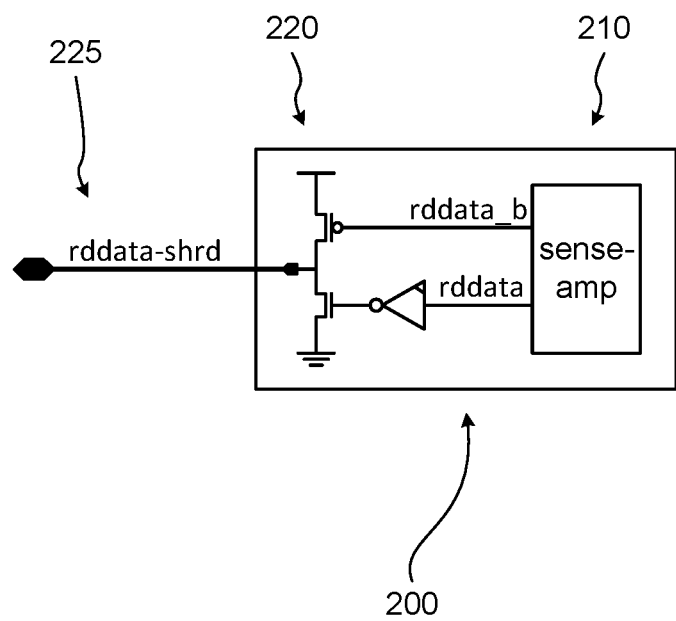
FIG. 2 illustrates a column Input/Output (col-IO) circuitry, in accordance with some embodiments of the disclosure.

FIG. 2 illustrates a col-IO circuitry, in accordance with some embodiments of the disclosure. A col-IO circuitry 200 may reside in an SRAM block's col-IO logic. Col-IO circuitry 200 may comprise a sense amplifier 210 coupled to a tristatable driver 220. Tristatable driver 220 may transfer one or more outputs of sense amplifier 210 to a read-data net 225. (As discussed herein, read-data net 225 may be a shared net within an SRAM array.)

In a standby mode, when output nets of sense amplifier 210 (e.g., a read-data net and a read-data-bar net) are pre-charged high, tristatable driver 220 may be in a tristate mode, and might not drive read-data net 225. Then, during a read operation, at least one output of sense amplifier 210 may be driven low, and tristatable driver 220 may in turn drive a value high or low onto read-data net 225 accordingly. For example, a read-data output of sense amplifier 210 may be driven low (e.g., may have a low voltage value, or a "0"), which may correspond with col-IO circuitry 200 driving read-data net 225 low. Alternatively, a read-data-bar output of sense amplifier 210 may be driven low (e.g., may have a low voltage value, or a "0"), which may correspond with col-IO circuitry 200 driving read-data net 225 high.

Figure 3:
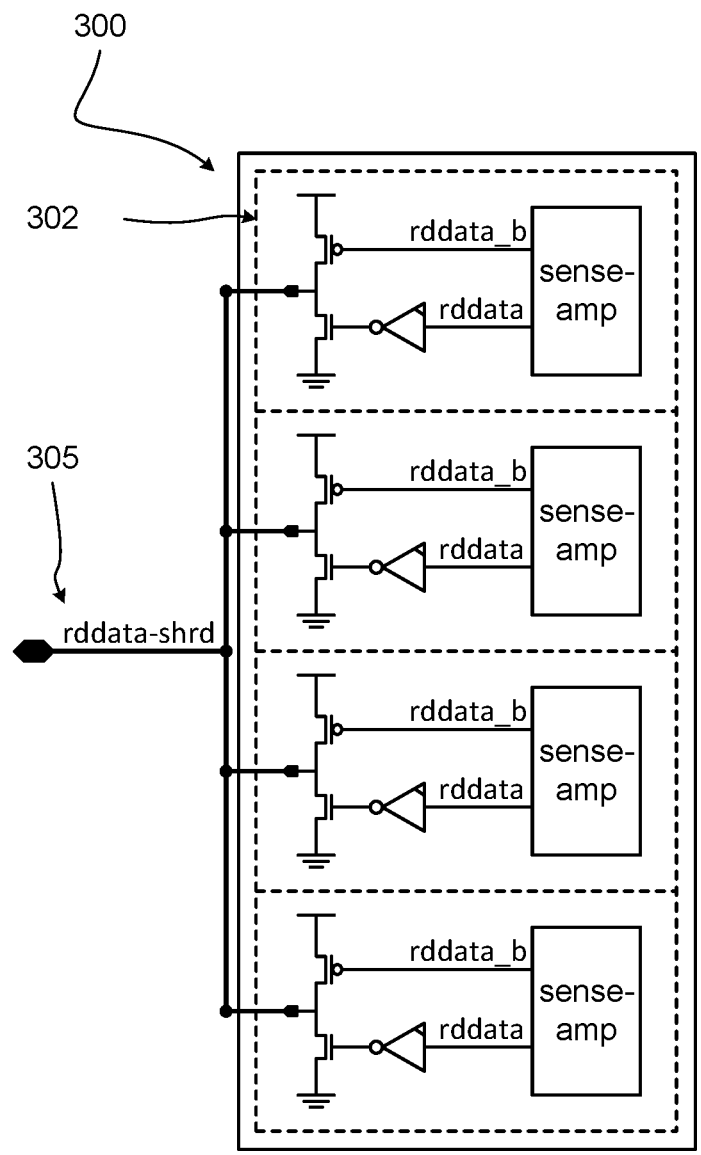
FIG. 3 illustrates a plurality of coupled col-IO circuitries, in accordance with some embodiments of the disclosure.

FIG. 3 illustrates a plurality of coupled col-IO circuitries, in accordance with some embodiments of the disclosure. A composite col-IO circuitry 300 may comprise a plurality of col-IO circuitries 302 (which may be substantially similar to col-IO circuitry 200). Accordingly, with a plurality of col-IO circuitries 302, a plurality of sense amplifiers may be coupled to a shared read-data net 305 (through a corresponding plurality of tristatable drivers of col-IO circuitries 302). This may advantageously make such col-IO circuitries scalable and compiler-friendly.

In various embodiments, one sense amplifier at a time may drive shared read-data net 305 during a read operation, which may prevent data corruption. The prevention of data corruption may thus be accomplished using col-IO circuitries 302 using a relatively small number of logic devices. Moreover, little to no additional circuitry may be used for enabling purposes and/or pre-charging purposes, which may advantageously make col-IO circuitries 302 more area-efficient and/or power-efficient than other circuitries.

In addition, in a sleep mode, much or all of this circuitry may be disconnected from various power rails, which may reduce leakage current, with little to no interruption of output data after wake-up.

Figure 4:
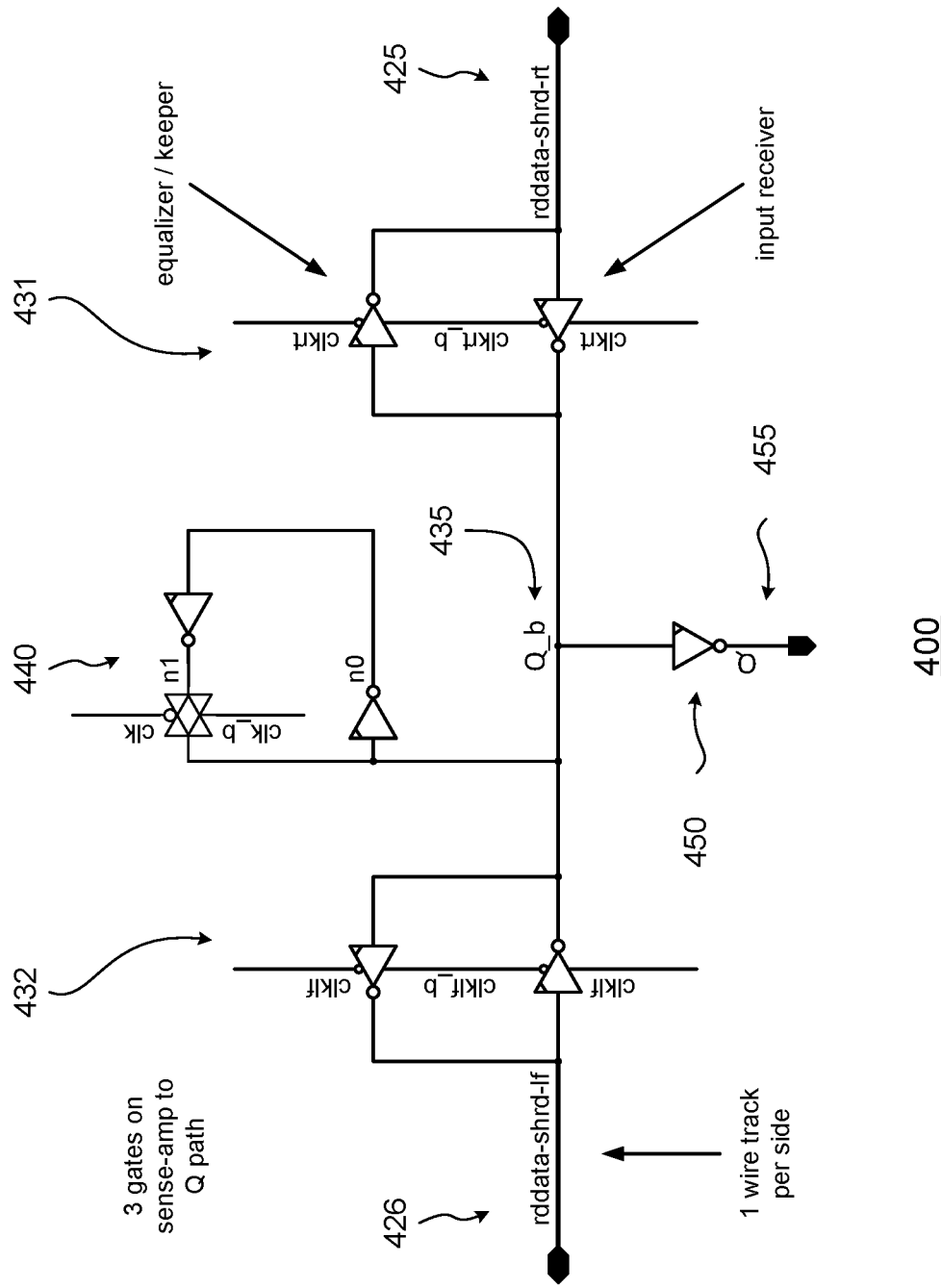
FIG. 4 illustrates a midblock Input/Output (IO) multiplexing and latching circuitry, in accordance with some embodiments of the disclosure.

FIG. 4 illustrates a midblock IO multiplexing and latching circuitry, in accordance with some embodiments of the disclosure. A midblock IO circuitry 400 may comprise a first receiver/keeper circuitry 431, a second receiver/keeper circuitry 432, a clocked latching circuitry 440, and an output driver circuitry 450.

First receiver/keeper circuitry 431 and second receiver/keeper circuitry 432 may comprise interruptible input receivers that form 2-to-1 multiplexors. First receiver/keeper circuitry 431 may include an input receiver connected to a first shared read-data net 425, which may receive read-data from SRAM blocks on a first side of a midblock region (e.g., a right-side shared read-data net which may receive read-data from a right side of the midblock region). Second receiver/keeper circuitry 432 may include an input receiver connected to a second shared read-data net 426, which may receive read-data from SRAM blocks on a second side of the midblock region (e.g., a left-side shared read-data net which may receive read-data from a left side of the midblock region).

In addition, first receiver/keeper circuitry 431 and second receiver/keeper circuitry 432 may include smaller interruptible drivers (e.g., equalizers) connected to first shared read-data net 425 and second shared read-data net 426, respectively. The interruptible drivers may equalize and/or keep data on the shared read-data nets when they are not driven by SRAM blocks. In various embodiments, col-IO circuitries on one or both sides of midblock IO circuitry 400 may be connected to midblock IO circuitry 400 with a single track per side.

Clocked latching circuitry 440 may be formed by back-to-back inverters and a transmission gate which might advantageously not introduce contention and/or additional gate delay on the output path. The input receiver of first receiver/keeper circuitry 431, the input receiver of second receiver/keeper circuitry 432, and clocked latching circuitry 440 may alternately drive an internal inverse-data net 435 coupled to an input of output driver circuitry 450. In turn, output driver circuitry 450 may drive a data output 455 of the SRAM array. In various embodiments, there may be merely three logic gates from the sense amplifier to data output 455.

Clocked latching circuitry 440 may employ three clock signals (and their complements). First receiver/keeper circuitry 431 may be clocked by a first-side clock signal and a first-side clock-bar signal (e.g., "right-clock" and "right-clock-bar" signals, respectively). Second receiver/keeper circuitry 432 may be clocked by a second-side clock signal and a second-side clock-bar signal (e.g., "left-clock" and "left-clock-bar" signals, respectively). Clocked latching circuitry 440 may be clocked by a clock signal and a clock-bar signal.

Figure 5:
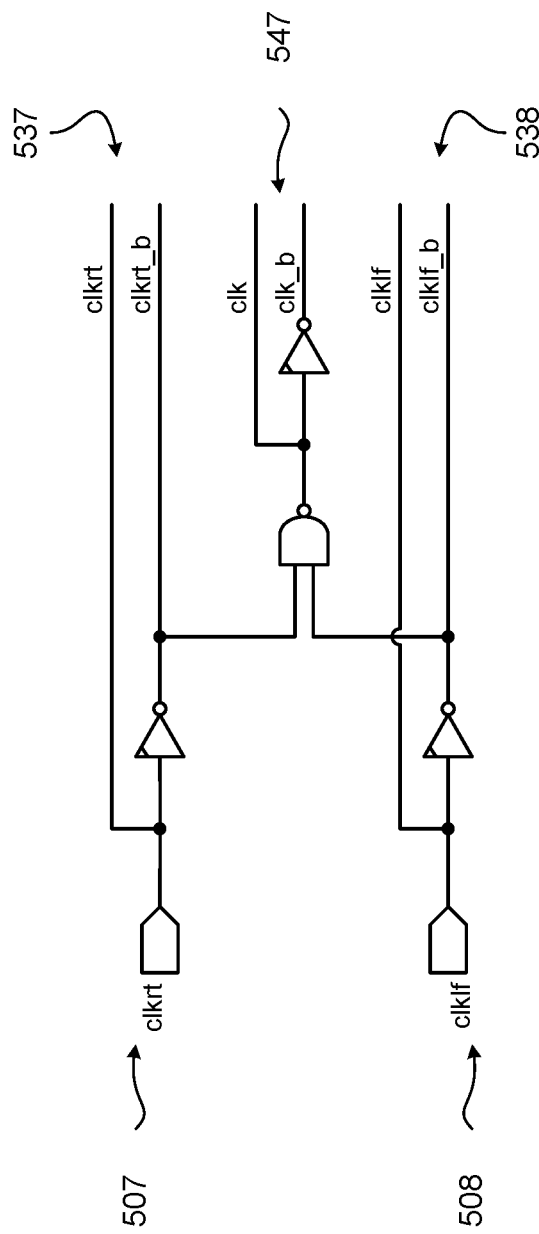
FIG. 5 illustrates a midblock IO clocking circuitry, in accordance with some embodiments of the disclosure.

FIG. 5 illustrates a midblock IO clocking circuitry, in accordance with some embodiments of the disclosure. A clocking circuitry 500 may comprise a first-side clock input 507 and a second-side clock input 508. A set of first-side clock/clock-bar signals 537 may be derived from first-side clock input 507, and a set of second-side clock/clock-bar signals 538 may be derived from second-side clock input 508. Meanwhile, a set of clock/clock-bar signals 547 may be derived from both first-side clock input 507 and second-side clock input 508.

In the context of midblock IO circuitry 400, in various embodiments, first-side clock/clock-bar signals 537 may drive first receiver/keeper circuitry 431, second-side clock/clock-bar signals 538 may drive second receiver/keeper circuitry 432, and clock/clock-bar signals 547 may drive clocked latching circuitry 440.

With respect to a variety of embodiments of the structures of FIGS. 2-5, an apparatus may comprise a first circuitry (e.g., col-IO circuitry 200), a second circuitry (e.g., first keeper/receiver circuitry 431), and a third circuitry (e.g., output driver circuitry 450). The first circuitry may have an output coupled to a shared-read-data signal path (e.g., first shared read-data net 425), and the first circuitry may either drive its output to a value based on a sensed memory bit, or not drive its output. The second circuitry may have a first clocked inverter (e.g., an input receiver) and a second clocked inverter cross-coupled with the first clocked inverter (e.g., a keeper/equalizer), an input of the first clocked inverter being coupled to the shared-read-data signal path, and an output of the first clocked inverter being coupled to an inverse-data signal path (e.g., internal inverse-data net 435). The third circuitry may have an inverter with an input coupled to the inverse-data signal path and an output coupled to a data signal path (e.g., data output 455).

In some embodiments, the first clocked inverter may have a positive-clock input connected to a first clock signal path (e.g., a first-side clock signal) and a negative-clock input connected to a second clock signal path (e.g., a first-side clock-bar signal). In addition, the second clocked inverter may have a positive-clock input connected to the second clock signal path and a negative-clock input connected to the first clock signal path. The second clock signal path may carry an inverse of a signal carried on the first clock signal path.

For some embodiments, the sensed memory bit may be a first sensed memory bit, the apparatus may comprise an additional circuitry (e.g., another col-IO circuitry) having an output coupled to the shared-read-data signal path, and the additional circuitry may either drive its output to a value based on a second sensed memory bit, or not drive its output. In some embodiments, the shared-read-data signal path may be a first shared-read-data signal path, the apparatus may comprise an additional circuitry (e.g., second receiver/keeper circuitry 432) having a third clocked inverter (e.g., an input receiver) and a fourth clocked inverter cross-coupled with the third clocked inverter (e.g., a keeper/equalizer), an input of the third clocked inverter being coupled to a second shared-read-data signal path (e.g., second shared read-data net 426), and an output of the third clocked inverter being coupled to the inverse-data signal path.

In some embodiments, the third clocked inverter may have a positive-clock input connected to a third clock signal path (e.g., a second-side clock signal) and a negative-clock input connected to a fourth clock signal path (e.g., a second-side clock-bar signal). In addition, the fourth clocked inverter may have a positive-clock input connected to the fourth clock signal path and a negative-clock input connected to the third clock signal path. The fourth clock signal path may carry an inverse of a signal carried on the third clock signal path.

For some embodiments, the first clock signal path and the third clock signal path may be independently driven (e.g., the cycling of their corresponding clocks may be independent). In some embodiments, the apparatus may comprise a clock circuitry (e.g., clocking circuitry 500) having a first output carrying an OR of the first clock signal path and the third clock signal path, and a second output carrying an inverse of the first output.

In some embodiments, the apparatus may comprise a clocked latching circuitry (e.g., clocked latching circuitry 440) having a data input connected to the inverse-data signal path, a data output connected to the inverse-data signal path, a positive-clock input connected to the second output of the clock circuitry, and a negative-clock input connected to the first output of the clock circuitry.

Alternatively, with respect to a variety of embodiments of the structures of FIGS. 2-5, an apparatus may comprise comprising a driver circuitry (e.g., col-IO circuitry 200), a receiver-and-keeper circuitry (e.g., first keeper/receiver circuitry 431), and an inverter (e.g., output driver circuitry 450). The driver circuitry may have a sense amplifier (e.g., sense amplifier 210) and an output coupled to a shared-read-data signal path (e.g., first shared read-data net 425), the driver circuitry to either drive its output to a value of a sensed memory bit during a read operation of its sense amplifier, or not drive its output during a standby mode of its sense amplifier. The receiver-and-keeper circuitry may have cross-coupled clocked inverters, one of the clocked inverters (e.g., an input receiver) having an input coupled to the shared-read-data signal path and an output coupled to an inverse-data signal path. The inverter may have an input coupled to the inverse-data signal data path and an output coupled to a data signal path.

In some embodiments, a first clocked inverter of the receiver-and-keeper circuitry (e.g., the input receiver) may have a positive-clock input connected to a first clock signal path (e.g., a first-side clock signal) and a negative-clock input connected to a second clock signal path (e.g., a first-side clock-bar signal). In addition, a second clocked inverter of the receiver-and-keeper circuitry (e.g., a keeper/equalizer) may have a positive-clock input connected to the second clock signal path and a negative-clock input connected to the first clock signal path. The second clock signal path may carry an inverse of a signal carried on the first clock signal path.

For some embodiments, the driver circuitry may be a first driver circuitry, the sensed memory bit may be a first sensed memory bit, the apparatus may comprise a second driver circuitry (e.g., another col-IO circuitry 200) having a sense amplifier and an output coupled to the shared-read-data signal path, and the second driver circuitry may either drive its output to a value of a second sensed memory bit during a read operation of its sense amplifier, or not drive its output during a standby mode of its sense amplifier.

In some embodiments, the shared-read-data signal path may be a first shared-read-data signal path, the receiver-and-keeper circuitry may be a first receiver-and-keeper circuitry, and the apparatus may comprise a second receiver-and-keeper circuitry (e.g., second keeper/receiver circuitry 432) having cross-coupled clocked inverters, one of the clocked inverters (e.g., an input receiver) having an input coupled to a second shared-read-data signal path and an output coupled to the inverse-data signal path.

For some embodiments, a first clocked inverter of the second receiver-and-keeper circuitry (e.g., an input receiver) may have a positive-clock input connected to a third clock signal path (e.g., a second-side clock signal) and a negative-clock input connected to a fourth clock signal path (e.g., a second-side clock-bar signal). In addition, a second clocked inverter of the second receiver-and-keeper circuitry (e.g., a keeper/equalizer) may have a positive-clock input connected to the fourth clock signal path and a negative-clock input connected to the third clock signal path. The fourth clock signal path may carry an inverse of a signal carried on the third clock signal path.

In some embodiments, the first clock signal path and the third clock signal path may be independently driven (e.g., the cycling of their corresponding clocks may be independent). For some embodiments, the apparatus may comprise a clock circuitry (e.g., clocking circuitry 500) having a first output carrying an OR of the first clock signal path and the third clock signal path, and a second output carrying an inverse of the first output (e.g., a clk signal and clk_b signal, respectively, of clock/clock-bar signals 547).

For some embodiments, the apparatus may comprise a clocked latching circuitry (e.g., clocked latching circuitry 440) having a data input connected to the inverse-data signal path, a data output connected to the inverse-data signal path, a positive-clock input connected to the second output of the clock circuitry, and a negative-clock input connected to the first output of the clock circuitry.

Figure 6:
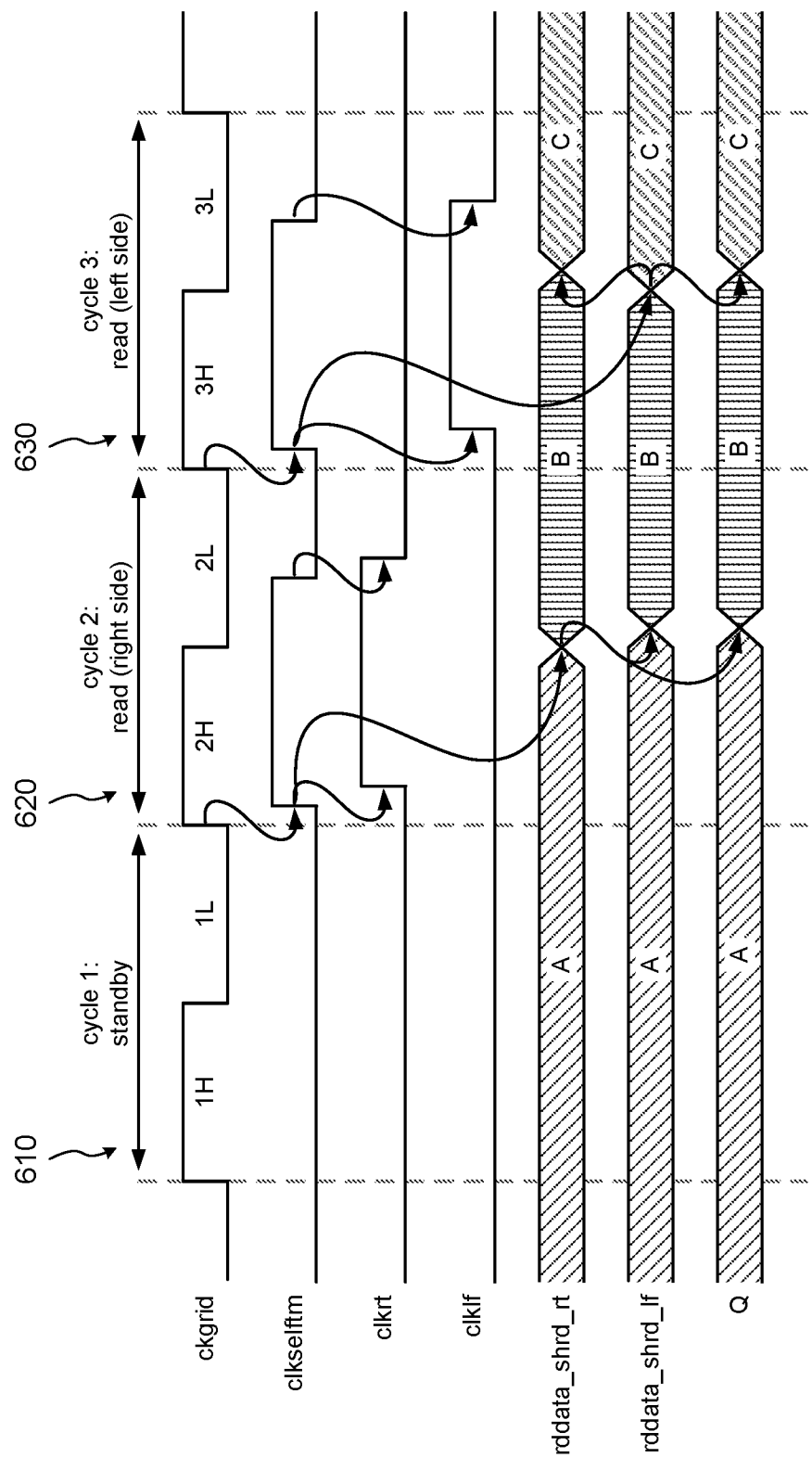
FIG. 6 illustrates a timing diagram for a midblock IO circuitry, in accordance with some embodiments of the disclosure.

FIG. 6 illustrates a timing diagram for a midblock IO circuitry, in accordance with some embodiments of the disclosure. A timing diagram 600 depicts a master clock (e.g., ckgrid), a self-timed clock (e.g, clkselftm), a first-side clock (e.g., clkrt), a second-side clock (e.g., clklf), a first-side shared read-data net (e.g., rddata_shrd_rt), a second-side shared read-data net (e.g., rddata_shrd_lf), and a data output (e.g., Q). Timing diagram 600 may encompass a first clock cycle 610, a second clock cycle 620, and a third clock cycle 630 (which may be cycles of the master clock).

First clock cycle 610 may pertain to a standby state. The first-side clock and the second-side clock may be driven low. Input receivers of a first receiver/keeper circuitry and a second receiver/keeper circuitry may be disengaged (e.g., by virtue of the first-side clock and the second-side clock being deasserted), and their most-recent data output value may be held (e.g., via a clocked latching circuitry). In addition, equalizer drivers of both the first receiver/keeper circuitry and the second receiver/keeper circuitry may be engaged, and may keep the same previously-read value on the first-side shared read-data net and the second-side shared read-data net, respectively.

Second clock cycle 620 may pertain to a first-side read (e.g., a right-side read). Based on the self-timed clock being cycled, the first-side clock may be cycled (while the second-side clock may remain driven low), and the first side may accordingly be activated. An input receiver of the first receiver/keeper circuitry may be enabled, and a driver (e.g., an equalizer driver) of the first receiver/keeper circuitry may be disengaged. Meanwhile, an input receiver and a driver (e.g., an equalizer driver) of the second receiver/keeper circuitry may keep their previous state (as in the standby state). The first-side shared read-data net and the second-side shared read-data net having been equalized to the same previously latched value, no glitch may occur on the data output during this transition.

Third clock cycle 630 may pertain to a second-side read (e.g., a left-side read). Based on the self-timed clock being cycled, the second-side clock may be cycled (while the first-side clock may remain driven low), and the second side may accordingly be activated. The input receiver of the second receiver/keeper circuitry may be enabled, and the driver of the second receiver/keeper circuitry may be disengaged. Meanwhile, the input receiver and the driver of the first receiver/keeper circuitry may keep their previous state.

Accordingly, at a point in the middle of a read cycle, new read data may arrive in the midblock IO circuitry and an internal inverse-data net coupled to the data output (e.g., Q_b) may switch. Upon this transition, the driver of the side which has remained engaged from the beginning may start driving this new value to the opposite side, making it ready for the next read operation. Eventually, when the read operation finishes by the self-timed clock, all logic elements may return to the standby state.

Since an equalization process may start immediately upon arrival of read-data in the midblock IO circuitry, this operation may advantageously finish earlier in comparison with other methods in which pre-charging of nets is started after a sense amplifier disengagement at the end of a cycle. Therefore, a maximum frequency might advantageously be not negatively impacted by this operation. In addition, equalization may occurring merely if a new read value is different from a previously-read value, which may advantageously save dynamic power.

Figure 7:
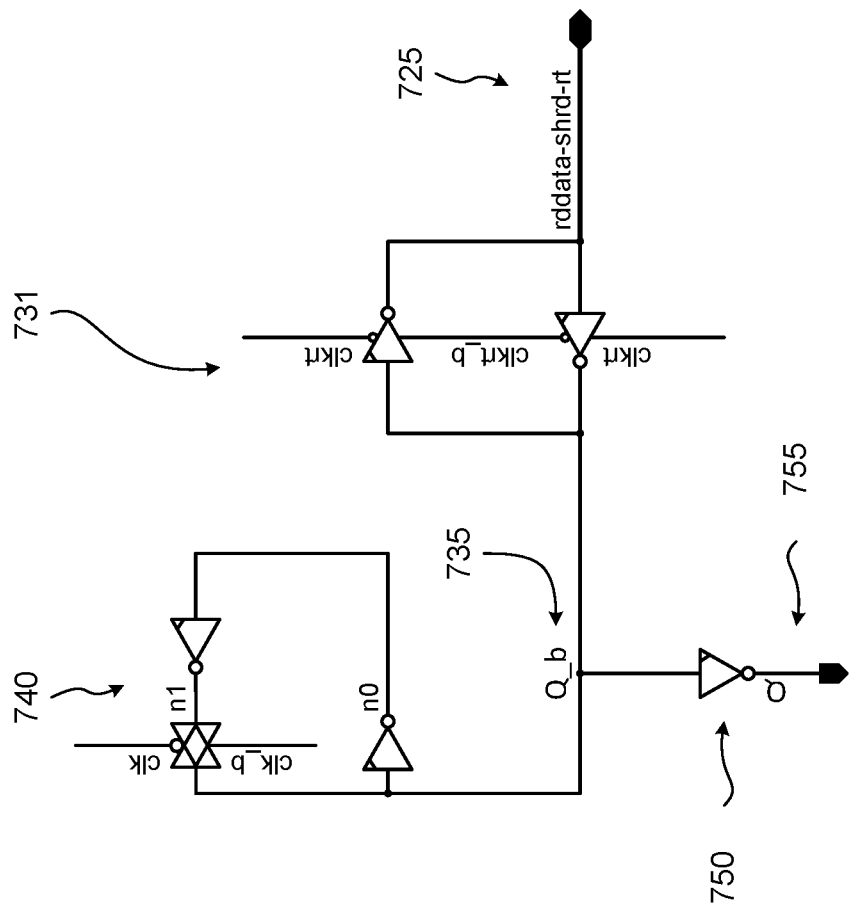
FIG. 7 illustrates a midblock IO multiplexing and latching circuitry for one-sided configurations, in accordance with some embodiments of the disclosure.

In some embodiments, the mechanisms and methods disclosed herein may be applied to one-sided configurations as well. FIG. 7 illustrates a midblock IO multiplexing and latching circuitry for one-sided configurations, in accordance with some embodiments of the disclosure. A midblock IO circuitry 700 may comprise a receiver/keeper circuitry 731, a clocked latching circuitry 740, and an output driver circuitry 750.

Receiver/keeper circuitry 731 may include an input receiver connected to a shared read-data net 725 which may receive read-data from SRAM blocks on one side of a midblock region (e.g., a right-side shared read-data net which may receive read-data from a right side of the midblock region). In addition, receiver/keeper circuitry 731 may include a smaller interruptible driver (e.g., equalizer) connected to shared read-data net 725. The interruptible driver may equalize and/or keep data on the shared read-data net when it is not driven by SRAM blocks.

Clocked latching circuitry 740 may be formed by back-to-back inverters and a transmission gate which might advantageously not introduce contention and/or additional gate delay on the output path. The input receiver of receiver/keeper circuitry 731 and clocked latching circuitry 740 may alternately drive an internal inverse-data net 735 coupled to an input of output driver circuitry 750. In turn, output driver circuitry 750 may drive a data output 755 of the SRAM array.

Thus, midblock IO circuitry 700 may accordingly be substantially similar to midblock IO circuitry 400, but may have only a single receiver/keeper circuitry for a single side. Accordingly, it may be possible to further simplify a midblock IO circuitry for single-sided SRAM arrays. In such configurations one or more SRAM blocks may be located on one side of the midblock IO circuitry. Equalization may not occur and, and further dynamic power saving may be achieved.

Figure 8:
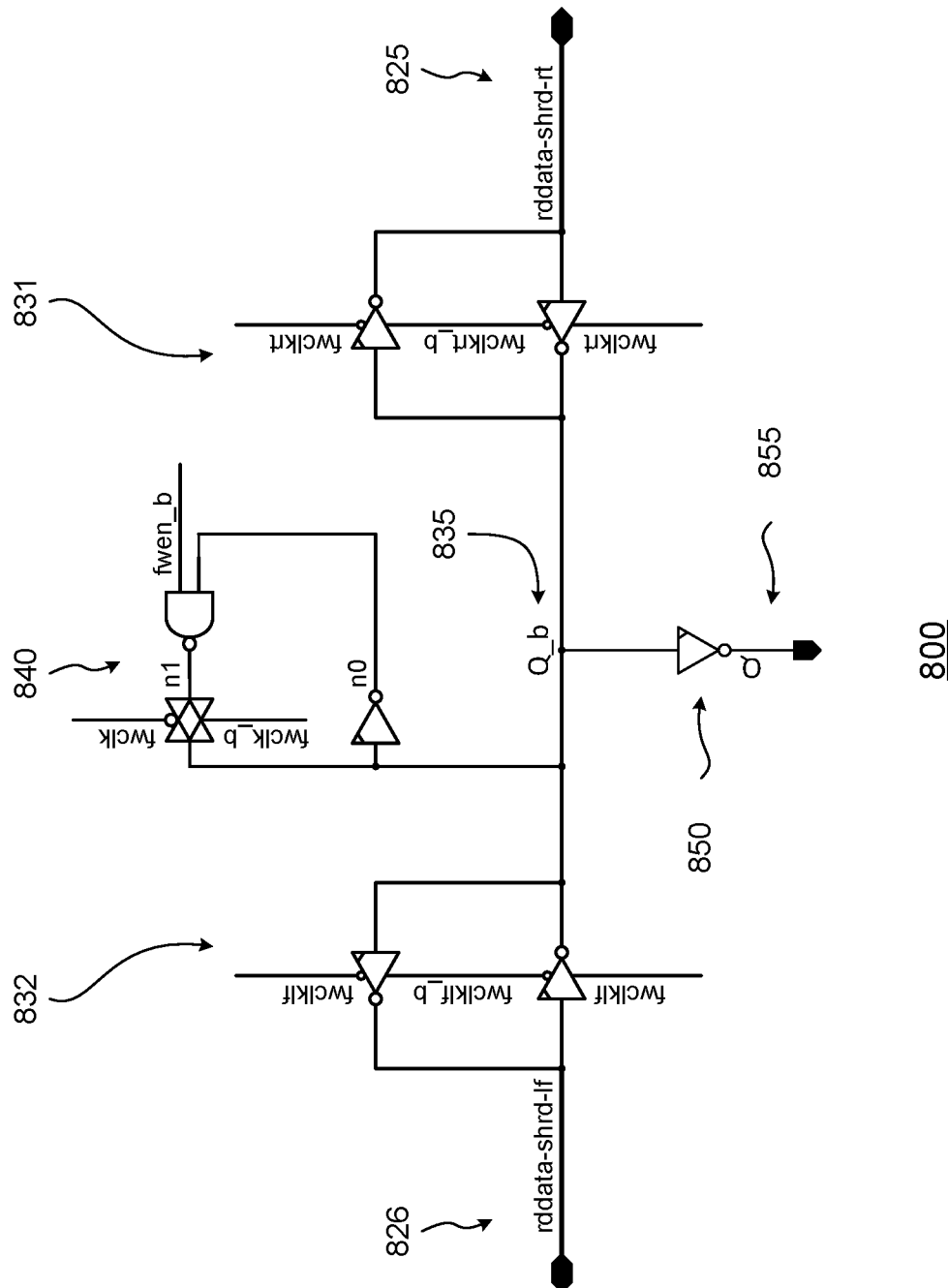
FIG. 8 illustrates a midblock IO multiplexing and latching circuitry incorporating output firewall functionality, in accordance with some embodiments of the disclosure.
Figure 9:
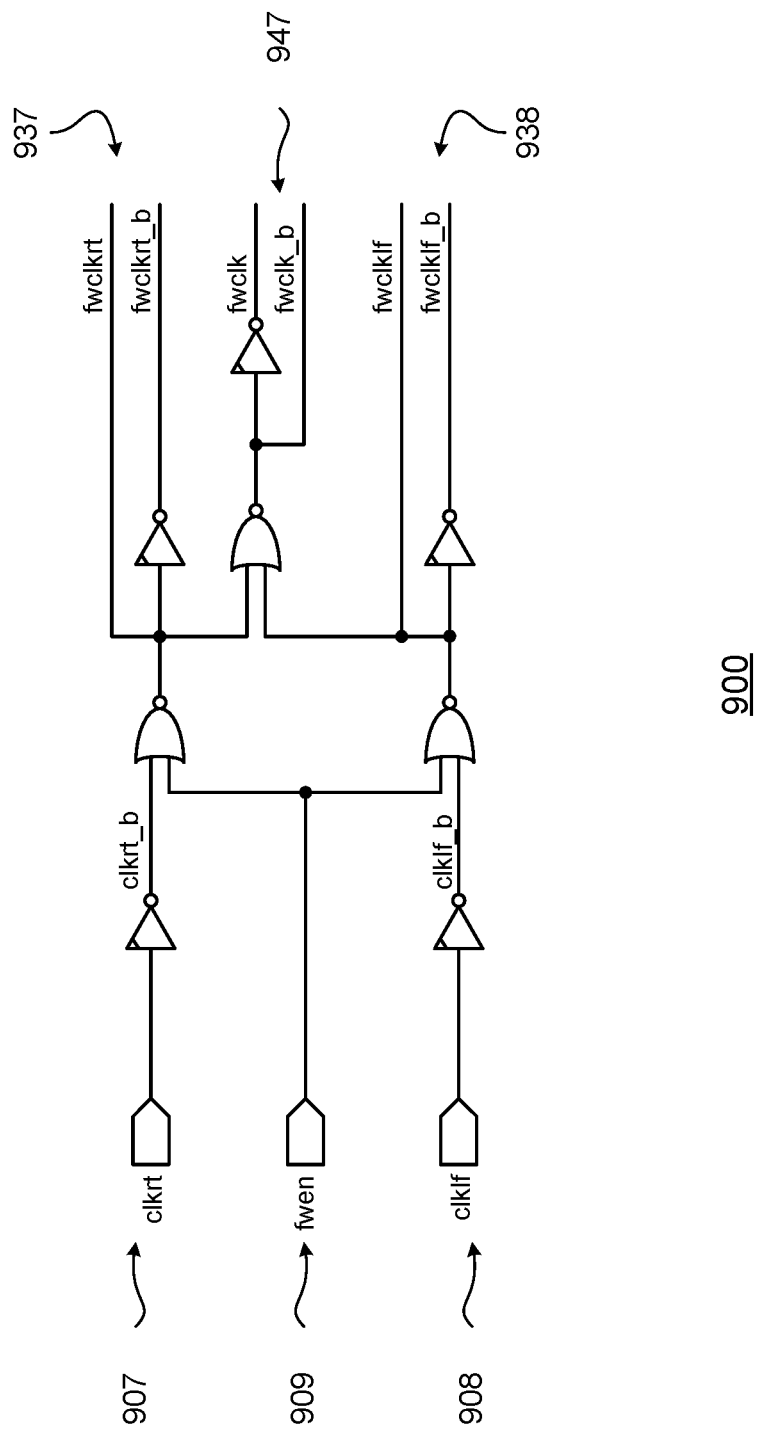
FIG. 9 illustrates a midblock IO clocking circuitry incorporating output firewall functionality, in accordance with some embodiments of the disclosure.

In some embodiments, the mechanisms and methods disclosed herein may be applied to various different configurations. FIG. 8 illustrates a midblock IO multiplexing and latching circuitry incorporating output firewall functionality, in accordance with some embodiments of the disclosure, and FIG. 9 illustrates a midblock IO clocking circuitry incorporating output firewall functionality, in accordance with some embodiments of the disclosure.

With respect to FIG. 8, a midblock IO circuitry 800 may comprise a first receiver/keeper circuitry 831, a second receiver/keeper circuitry 832, a clocked latching circuitry 840, and an output driver circuitry 850. First receiver/keeper circuitry 831 may include an input receiver connected to a first shared read-data net 825 which may receive read-data from SRAM blocks on a first side of a midblock region (e.g., a right-side shared read-data net, which may receive read-data from a right side of the midblock region). Second receiver/keeper circuitry 832 may include an input receiver connected to a second shared read-data net 826, which may receive read-data from SRAM blocks on a second side of the midblock region (e.g., a left-side shared read-data net which may receive read-data from a left side of the midblock region).

In addition, first receiver/keeper circuitry 831 and second receiver/keeper circuitry 832 may include smaller interruptible drivers (e.g., equalizers) connected to first shared read-data net 825 and second shared read-data net 826, respectively. The interruptible drivers may equalize and/or keep data on the shared read-data nets when they are not driven by SRAM blocks.

Clocked latching circuitry 840 may be formed by back-to-back inverters and a transmission gate which might advantageously not introduce contention and/or additional gate delay on the output path. The input receiver of first receiver/keeper circuitry 831, the input receiver of second receiver/keeper circuitry 831, and clocked latching circuitry 840 may alternately drive an internal inverse-data net 835 coupled to an input of output driver circuitry 850. In turn, output driver circuitry 850 may drive a data output 855 of the SRAM array. In various embodiments, there may be merely three logic gates from the sense amplifier to data output 855.

First receiver/keeper circuitry 831 may be clocked by a first-side clock signal and a first-side clock-bar signal (e.g., "right-clock" and "right-clock-bar" signals, respectively). Second receiver/keeper circuitry 832 may be clocked by a second-side clock signal and a second-side clock-bar signal (e.g., "left-clock" and "left-clock-bar" signals, respectively). Clocked latching circuitry 840 may be clocked by a clock signal and a clock-bar signal.

With respect to FIG. 9, a clocking circuitry 900 may comprise a first-side clock input 907 and a second-side clock input 908. A set of first-side clock/clock-bar signals 937 may be derived from first-side clock input 907, and a set of second-side clock/clock-bar signals 938 may be derived from second-side clock input 908. Meanwhile, a set of clock/clock-bar signals 947 may be derived from both first-side clock input 907 and second-side clock input 908. In comparison with clock/clock-bar signals 547, clock/clock-bar signals 947 may additionally be derived from a firewall enable input signal 909.

In the context of midblock IO circuitry 800, in various embodiments, first-side clock/clock-bar signals 937 may drive first receiver/keeper circuitry 831, second-side clock/clock-bar signals 938 may drive second receiver/keeper circuitry 832, and clock/clock-bar signals 947 may drive clocked latching circuitry 840.

With respect to FIGS. 8 and 9, midblock IO circuitry 800 may accordingly be substantially similar to midblock IO circuitry 400, and clocking circuitry 900 may accordingly be substantially similar to clocking circuitry 500. In comparison with midblock IO circuitry 400, clocked latching circuitry 840 may comprise an additional input coupled to a firewall enable signal (e.g., firewall enable input 909), which may permit midblock IO circuitry 800 to govern the enabling of an output firewall feature (e.g., to isolate midblock IO circuitry 800). The output firewall feature may advantageously avoid introducing additional gate delays on the output speed path, which may leave performance characteristics of the SRAM array substantially similar to embodiments without the output firewall feature. As a result, characterization time and effort may advantageously be reduced when delivering intellectual property block (IPs) to a customer with addition of (or removal of) an output firewall feature.

Figure 10:
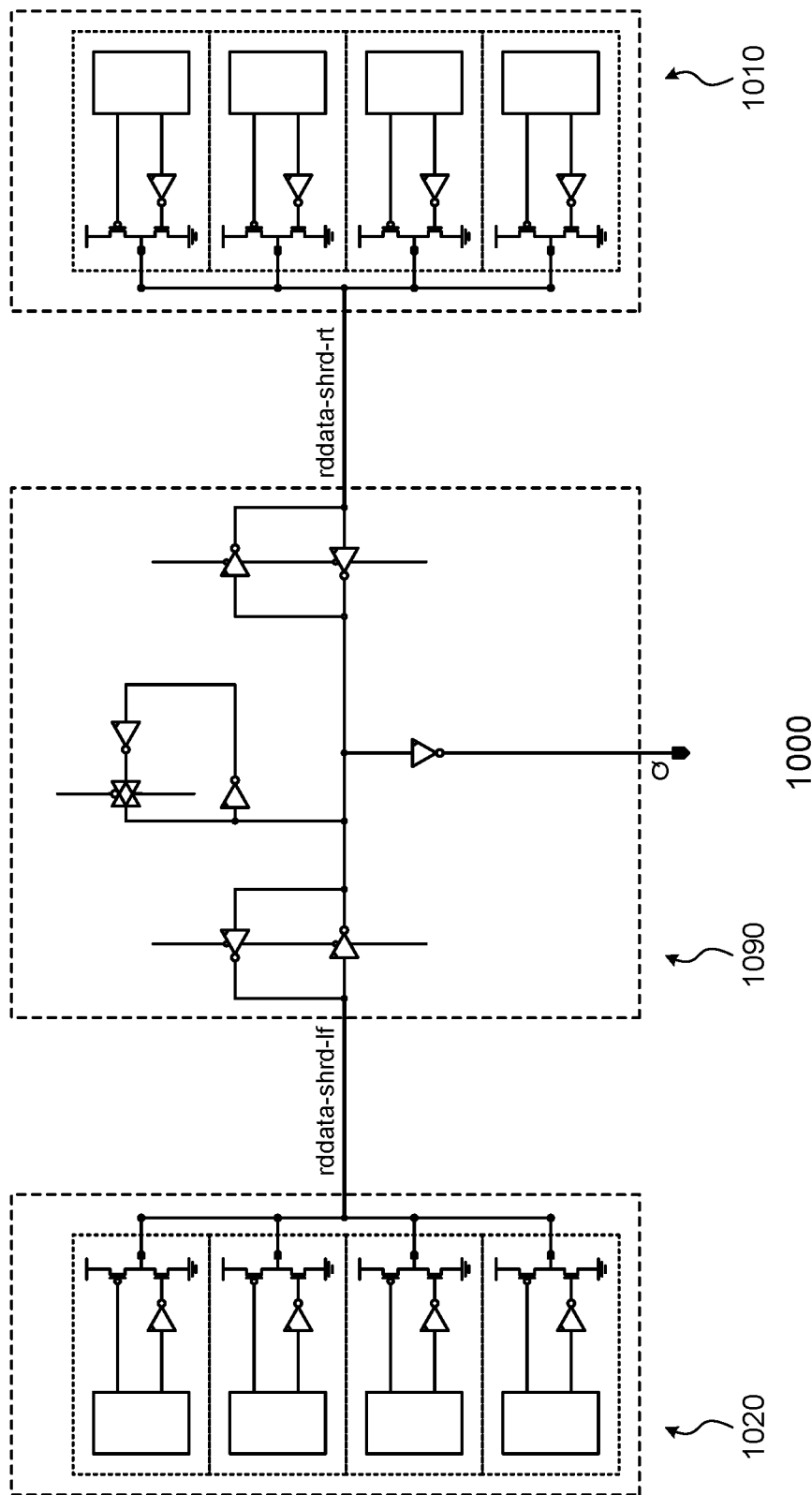
FIG. 10 illustrates a connectivity between a midblock IO circuitry and two SRAM blocks, in accordance with some embodiments of the disclosure.

Col-IO circuitries and midblock IO circuitries described herein may be coupled in various configurations, and. FIG. 10 illustrates a connectivity between a midblock IO circuitry and two SRAM blocks, in accordance with some embodiments of the disclosure, and FIG. 11 illustrates a connectivity between a midblock IO circuitry and four SRAM blocks, in accordance with some embodiments of the disclosure.

With respect to FIG. 10, an SRAM design 1000 may comprise a first col-IO circuitry 1010, a second col-IO circuitry 1020, and a midblock IO circuitry 1090. First col-IO circuitry 1010 and second col-IO circuitry 1020 may be substantially similar to composite col-IO circuitry 300, and midblock IO circuitry 1090 may be substantially similar to midblock IO circuitry 400.

A first shared read-data net of midblock IO circuitry 1090 (e.g., a right-side shared read-data net) may be coupled to a shared read-data net of first col-IO circuitry 1010. Similarly, a second shared read-data net of midblock IO circuitry 1090 (e.g., a left-side shared read-data net) may be coupled to a shared read-data net of second col-IO circuitry 1020.

Figure 11:
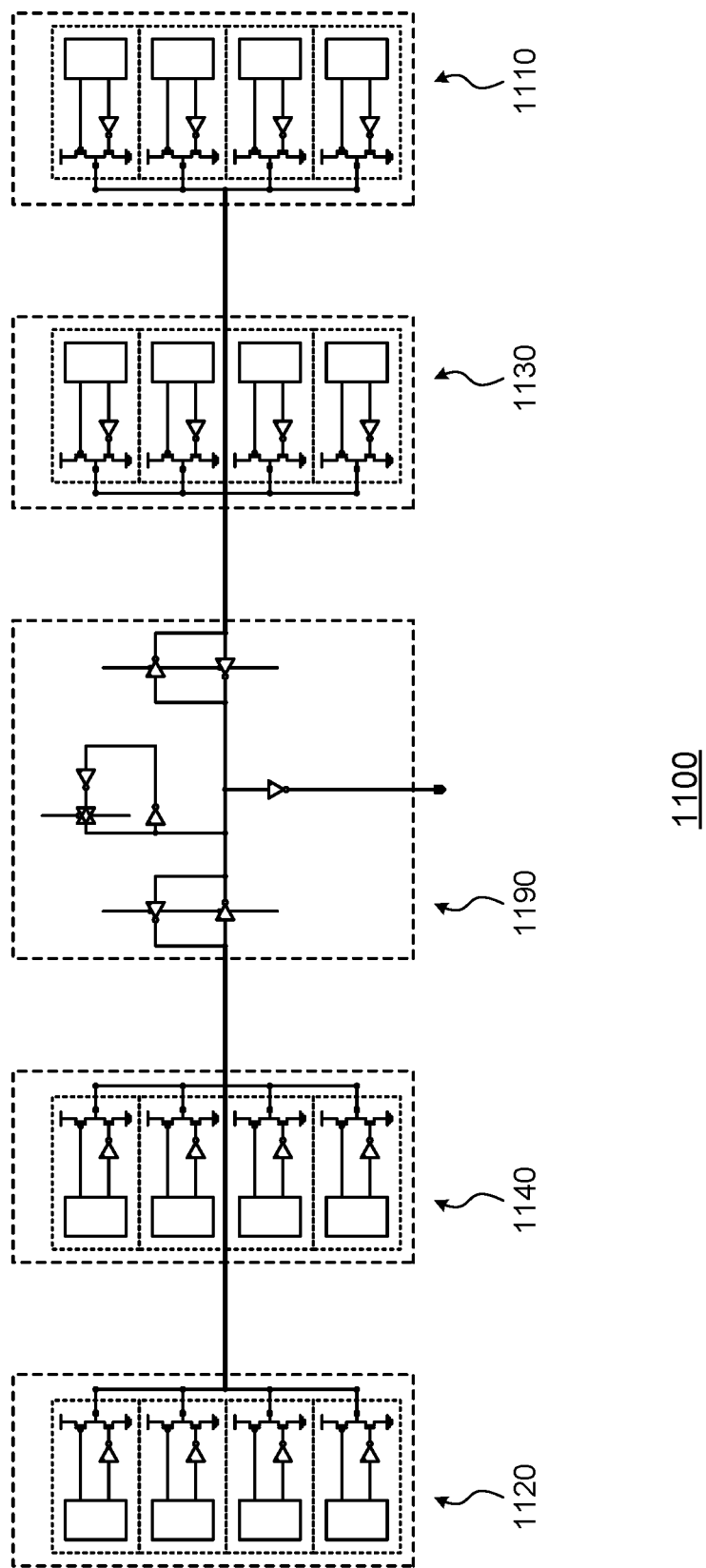
FIG. 11 illustrates a connectivity between a midblock IO circuitry and four SRAM blocks, in accordance with some embodiments of the disclosure.

With respect to FIG. 11, an SRAM design 1100 may comprise a first col-IO circuitry 1110, a second col-IO circuitry 1120, a third col-IO circuitry 1130, a fourth col-IO circuitry 1140, and a midblock IO circuitry 1190. First col-IO circuitry 1110, second col-IO circuitry 1120, third col-IO circuitry 1130, and fourth col-IO circuitry 1140 may be substantially similar to composite col-IO circuitry 300. Midblock IO circuitry 1190 may be substantially similar to midblock IO circuitry 400.

A first shared read-data net of midblock IO circuitry 1190 (e.g., a right-side shared read-data net) may be coupled to a shared read-data net of first col-IO circuitry 1110 and third col-IO circuitry 1130. Similarly, a second shared read-data net of midblock IO circuitry 1190 (e.g., a left-side shared read-data net) may be coupled to a shared read-data net of second col-IO circuitry 1120 and fourth col-IO circuitry 1140.

Accordingly, with respect to FIGS. 10-11, SRAM topologies incorporating the mechanisms and methods described herein may be expandable to multiple SRAM blocks. When a col-IO multiplexor order is changed, the logic in midblock might not change, which may advantageously result in demand for fewer unique macro cells.

Moreover, in most cases, a col-IO multiplexor may be disposed to have more high-layer horizontal metal resources allocated for internal routing. As a result, techniques that consume many high-layer horizontal metal resources for global routing between a midblock and SRAM blocks may not be feasible. However, with the mechanisms and methods disclosed herein, merely one shared read-data net track may be used, which may place a decreased burden on high-layer metal resources (e.g., metal track resources). This may in turn make these mechanisms and method suitable for various col-IO multiplexor configurations, and may allow the shared net to be fully shielded, which may improve speed and/or reliability.

Figure 12:
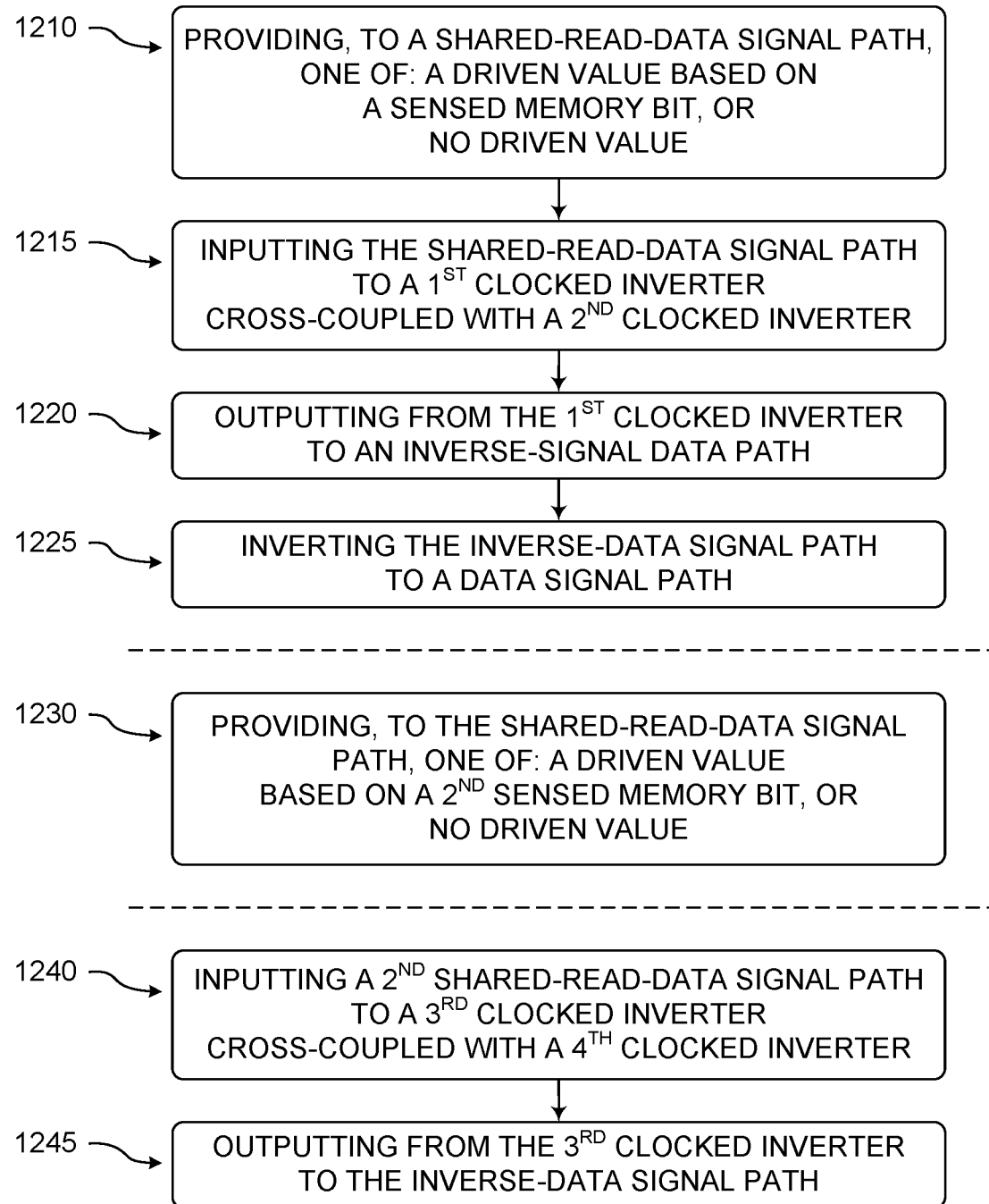
FIG. 12 illustrates methods for implementing multiplexing and latching of output read-data in an SRAM array, in accordance with some embodiments of the disclosure.

FIG. 12 illustrates methods for implementing multiplexing and latching of output read-data in an SRAM array, in accordance with some embodiments of the disclosure. A method 1200 may comprise a block 1210, a block 1215, a block 1220, and a block 1225.

In block 1210, either a driven value based on a sensed memory bit, or no driven value, may be provided to a shared-read-data signal path. In block 1215, the shared-read-data signal path may be inputted to a first clocked inverter cross-coupled with a second clocked inverter. In block 1220, the first clocked inverter may be outputted to an inverse-data signal path. In block 1225, the inverse-data signal path may be inverted and provided to a data signal path.

In some embodiments, method 1200 may comprise a block 1230. In some embodiments, the sensed memory bit may be a first sensed memory bit. In block 1230, either a driven value based on a second sensed memory bit, or no driven value, may be provided to the shared-read-data signal path.

In some embodiments, method 1200 may comprise a block 1240 and/or a block 1245. For some embodiments, the shared-read-data signal path may be a first shared-read-data signal path. In block 1240, a second shared-read-data signal path may be inputted to a third clocked inverter cross-coupled with a fourth clocked inverter. In block 1245, the third clocked inverter may be outputted to the inverse-data signal path.

In some embodiments, the cross-coupled first clocked inverter and second clocked inverter may be driven independently of the cross-coupled third clocked inverter and fourth clocked inverter.

Although the blocks in the flowchart with reference to FIG. 12 are shown in a particular order, the order of the blocks can be modified. Thus, the illustrated embodiments can be performed in a different order, and some blocks may be performed in parallel. Some of the blocks and/or operations listed in FIG. 12 are optional in accordance with certain embodiments. The numbering of the blocks presented is for the sake of clarity and is not intended to prescribe an order of operations in which the various blocks must occur. Additionally, operations from the various flows may be utilized in a variety of combinations.

In some embodiments, an apparatus may comprise means for performing various blocks and/or operations of the methods of FIG. 12.

Moreover, in some embodiments, machine readable storage media may have executable instructions that, when executed, cause one or more processors to perform an operation comprising a method of FIG. 12. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

Some embodiments disclosed herein may pertain to mechanisms and methods for improving sense-to-data-out performance of a read data-path for SRAM memories. With respect to such embodiments, in high performance memory design (e.g., SRAM design), transmitting data stored in an array to a final output port reliably, in as little time possible, may be a challenge. One method to improve read data-path timing performance may be to reduce the amount of resistance and/or capacitance (RC) parasitic loading on lengthy data signal lines. A common technique to reduce such line loading may be implementation of a partitioned memory block architecture.

Disclosed herein are mechanisms and methods for improving sense-to-data-out (e.g., "sense-to-q") performance of a read data-path for single-block and multiple-block partitioned SRAM memories. Various embodiments may pertain to use of dedicated parallel pull-down devices that may be independent of a secondary NAND gate stage to yield a faster response time. Additional circuit elements may maintain a contention-free feedback latch path to retain the output data. The proposed read output path circuitry may present itself on a device in a repeated pattern for a plurality of IO slices.

These mechanisms and methods may advantageously improve a timing performance of circuit techniques used to multiplex, latch, and/or drive read-data to a final output port as received from pre-charged, true/complement global signal-line transitions propagated from a selected data array of a memory (e.g., a "sense-to-q" timing performance). The mechanisms and methods may advantageously yield higher performance with a better balance of timing delays between low-to-high output data transitions and high-to-low output data transitions, across a wide process, voltage, and temperature (PVT) range.

In addition to superior timing performance, the mechanisms and methods may advantageously improve leakage current and/or active power consumption, while remaining competitive in terms of layout area usage. Furthermore, the mechanisms and methods may advantageously use a read data-path technique that does not rely upon any carefully timed global control signals to be used in parallel to a local array block sense amplifier's signals. A mere data-line transition on the input may advantageously lead to multiplexing, latching, and driving the data to a final output, without either output circuitry to receive decoded address inputs to multiplex, or carefully clocked signals to mitigate latch contention.

Figure 13:
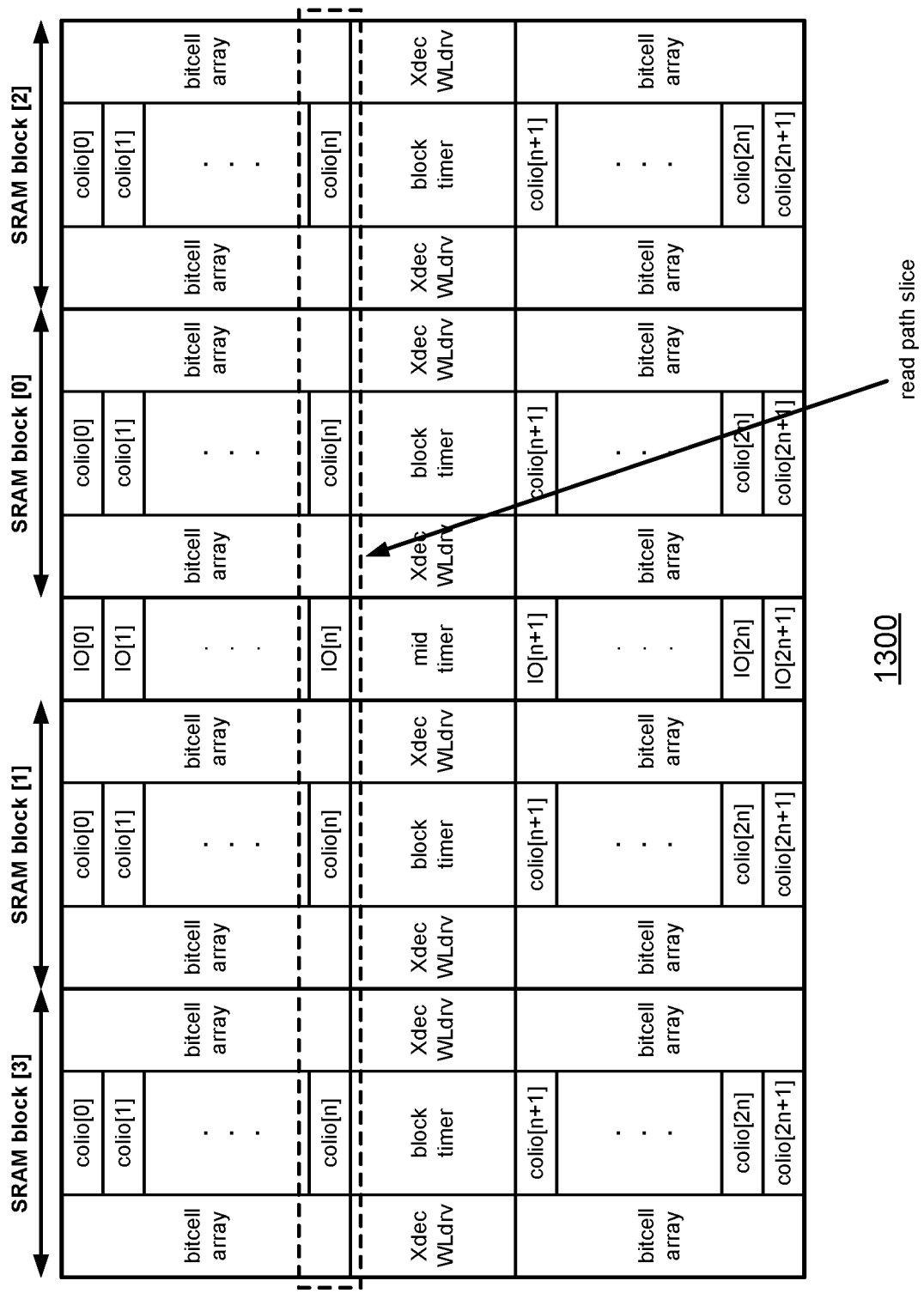
FIG. 13 illustrates a multi-block SRAM array topology, in accordance with some embodiments of the disclosure.

The mechanisms and methods may advantageously be compiler-friendly in that they may be used over a wide range of single-array-block and multiple-array-block configurations. The circuit topology may advantageously also be scalable across different technology nodes and PVT conditions. Accordingly, the mechanisms and methods may also advantageously be compiler friendly by responding to received long-range data signal transitions driven by array-sense blocks, which may have great timing variance over a full physical configuration range and/or PVT range demanded of the memory product FIG. 13 illustrates a multi-block SRAM array topology, in accordance with some embodiments of the disclosure. A topology 1300 may comprise a plurality of SRAM blocks and a shared control block (e.g., in a central portion of the design). Topology 1300 may comprise a plurality of read path slices (e.g., in a repeated pattern).

Figure 14:
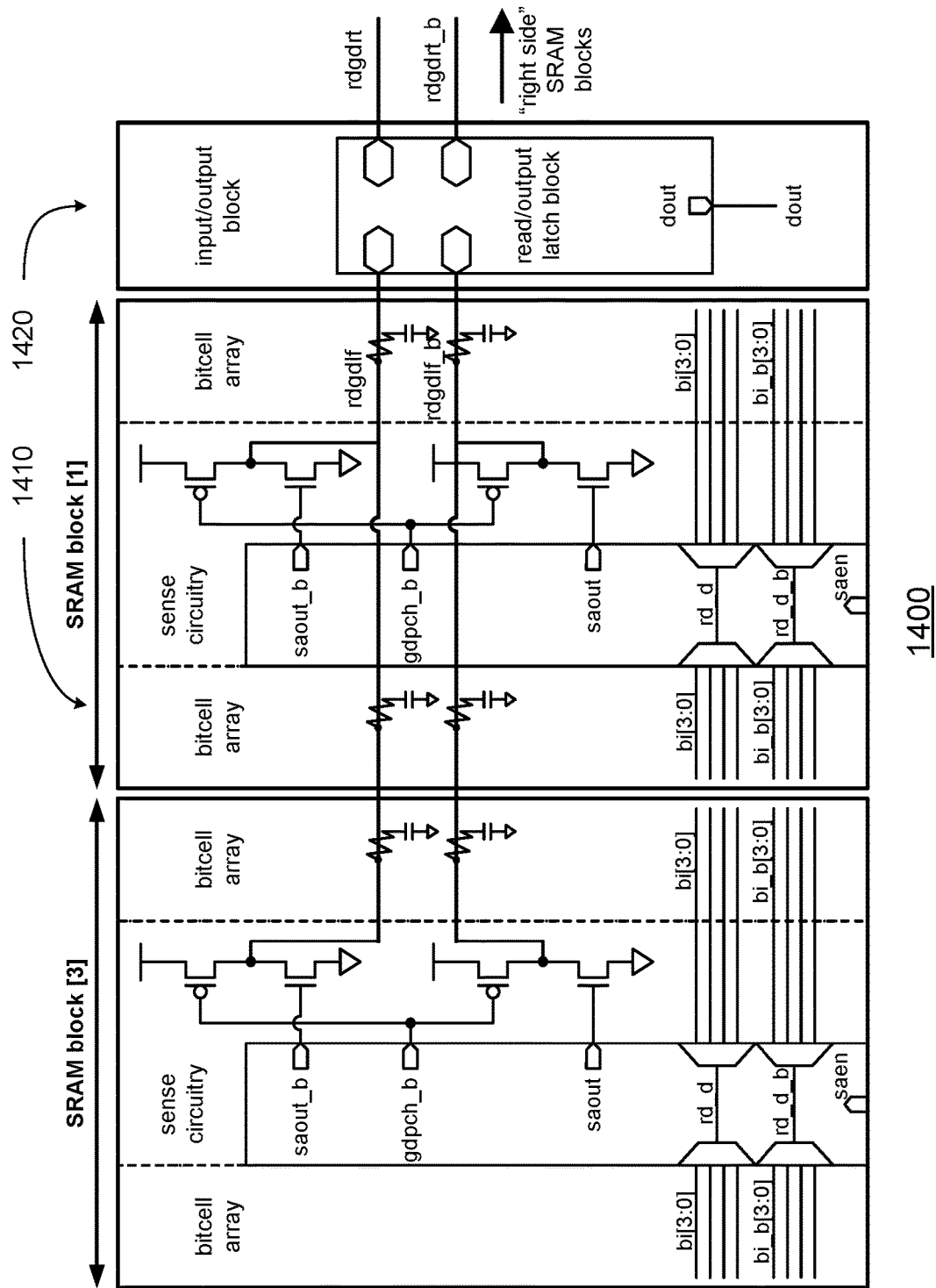
FIG. 14 illustrates part of a read data path slice and various signal lines and drivers therein, in accordance with some embodiments of the disclosure.

FIG. 14 illustrates part of a read data path slice and various signal lines and drivers therein, in accordance with some embodiments of the disclosure. A partial read-path slice 1400 may comprise one or more SRAM block portions 1410 and an IO block portion 1420. In various embodiments, a left-hand side of topology 1300 may comprise a plurality of partial read-path slices 1400.

SRAM block portions 1410 may comprise bitcell array portions and sense circuitry portions. The bitcell array portions may provide read-data (and read-data-bar) signaling to the sense circuitry portions. In turn, the sense circuitry portions may drive sensed output onto one or more read-data nets (which may be shared nets) connected to IO block portion 1420 (e.g., a read-data/read-data-bar pair).

IO block portion 1420 may then accept one or more read-data nets from one or more sides of an SRAM array topology, and in a read/output latch portion, may transmit the data to a data output.

In various embodiments, RC line loading from a bitcell array to an array sensing circuitry may be reduced by dividing data stored in bitcells into partitioned array blocks, with local sensing circuitry located in between two such blocks. Additional array-block pairs may be added to a memory configuration to meet the total data storage targets while capping the maximum size (e.g., number of bit rows) of the array blocks.

To reduce RC line loading at a secondary level from local-sense-blocks to an output, an IO block may be centered in between two physical halves of the memory to form a multiple-block "butterfly" architecture. This technique may reduce RC loading of global read data lines by half since it creates two separate sets of half-length signal-lines from two opposing sides. However, separate sided data-lines may lead read output circuitries to have the ability to multiplex to a selected side to receive the next state data on any given read operation.

Figure 15:
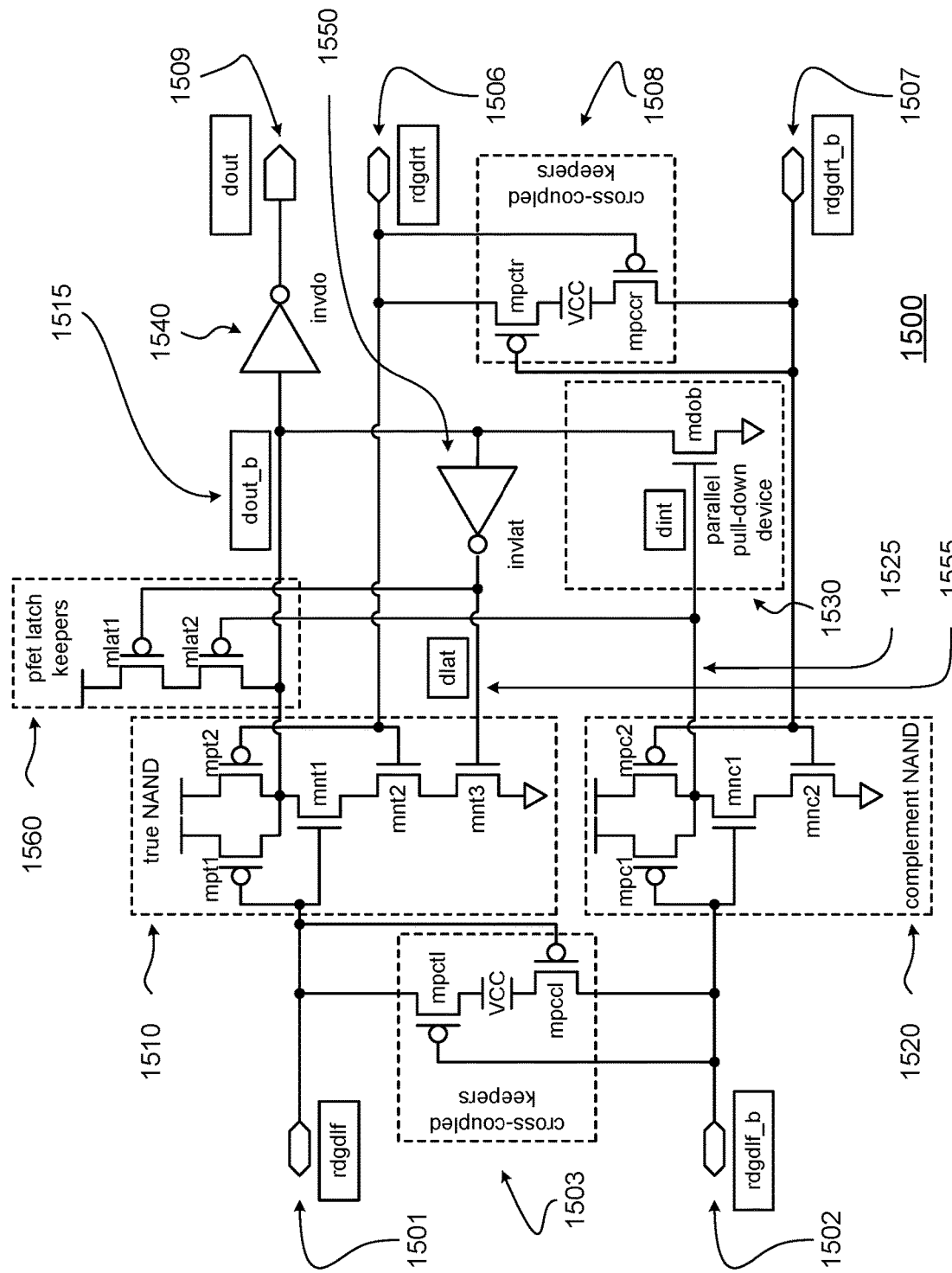
FIG. 15 illustrates a read output circuitry, in accordance with some embodiments of the disclosure.

FIG. 15 illustrates a read output circuitry, in accordance with some embodiments of the disclosure. A read output circuitry 1500 may be substantially similar to the read/output latch portion of IO block 1420. Read output circuitry 1500 comprises various p-channel field effect transistor ("pfet") elements, n-channel field effect transistor ("nfet") elements, and logic elements.

Read output circuitry 1500 may comprise two sets of paired true/complement data-line read signal inputs. In various embodiments, read output circuitry 1500 may comprise four read data signal lines: a first true input 1501 and a first complement input 1502 (e.g., rdgdlf and rdgdlf_b, respectively) corresponding with a first side of an SRAM memory array topology (e.g., a left-hand side), and a second true input 1506 and a second complement input 1507 (e.g., rdgrt and rdgrt_b, respectively) corresponding with a second side of the SRAM memory array topology (e.g., a right-hand side).

The four read data signal lines may be pre-charged and maintained high, at the supply voltage (e.g., Vcc), except during a sense amplifier activation for a portion of a read cycle. During a read operation, one of the four read data signal lines may pulse low for the duration of the sense amplifier activation. As the sense amplifier is activated, one of the paired data lines may be driven and may transition, leaving the other line in a tri-stated condition, which may be vulnerable to capacitive coupling or leakage current that could lower its voltage level.

To mitigate these effects, the read data signal lines are may be shielded by parallel-routed supply lines, and read output circuitry 1500 may comprise a first keeper circuitry 1503 and a second keeper circuitry 1508, which may comprise cross-coupled pfet devices on the true-complement data-line pairs (e.g., mpctl cross-coupled with mpccl, and mpctr cross-coupled with mpccr, respectively). So, for example, if first true input 1501 is driven low, it may turn on one of the cross-coupled pfet devices (e.g., mpccl) to hold first complement input 1502 to the supply voltage level. Upon pre-charge, that mppcl pfet device may be turned back off. The cross-coupled pfet devices of first keeper circuitry 1503 and second keeper circuitry 1508 may be relatively small devices, since they merely need to hold the signal lines against leakage and minor coupling effects.

In a prior design, in addition to the cross-coupled pfet devices, the read data signal lines were connected to "true" and "complement" NAND devices. For example, each of a first true input and a second true input were connected to gates of a pfet/nfet pair of a "true NAND" device, while each of a first complement input and a second complement input were connected to gates of a pfet/nfet pair of a "complement NAND" device. The output node of the "true NAND" device (e.g., a node between its pfets and its nfets) was then connected to a gate of a third, additional nfet of the "complement NAND" device, and similarly, the output node of the "complement NAND" device (e.g., a node between its pfets and its nfets) was connected to a gate of a third, additional nfet of the "true NAND" device. In this way, the output of each NAND device may have been fed to an input of the other NAND device. This cross-coupled output-to-input NAND gate configuration created an SR-latch function, which facilitated the maintenance of an output data state until new data of a new read operation became available.

In the prior design, a first pfet extended between Vcc and the output of the "true NAND" circuitry, and a second pfet extended between Vcc and the output of the "complement NAND" device. The gate of the first pfet was connected to the output node of the "complement NAND" device, and the gate of the second pfet was connected to the output node of the "true NAND" device. In addition, the output node of the "true NAND" device was also connected to the input of an inverter stage, which then drove the read data to an output data port (with appropriate drive strength), while the output node of the "complement NAND" device remained as an internal signal (e.g., "dlat").

However, for the prior design, high-to-low transitions on the output port and low-to-high transitions on the output port did not have balanced timing. The high-to-low transitions experienced less delay than the low-to-high transitions. These imbalances were not satisfactorily reconcilable by simply changing parameters of the underlying pfet and nfet devices.

The structures of read output circuitry 1500 differ in various ways from the structures of the prior design. Read output circuitry 1500 may comprise a true NAND circuitry 1510 and a complement NAND circuitry 1520. Each of first true input 1501 and second true input 1506 may be connected to gates of a pfet/nfet pair of true NAND circuitry 1510, while each of first complement input 1502 and second complement input 1507 may be connected to gates of a pfet/nfet pair of complement NAND circuitry 1520. Also, the output node of true NAND circuitry 1510, an internal "dout_b" node 1515, may be connected to the input of a driver inverter 1540, which may then drive read data to an output data port 1509.

However, read output circuitry 1500 may comprise a parallel pull-down device 1530, a feedback inverter 1550 (e.g., "invlat"), and a latch keeper circuitry 1560. Parallel pull-down device 1530 may be an nfet device extending between dout_b node 1515 and ground. The output node of complement NAND circuitry 1520, which may be an internal "dint" node 1525, may be connected to the gate of parallel pull-down device 1530. When turned on (e.g., when dint node 1525 has a value of "1"), parallel pull-down device 1530 may be dedicated to discharging dout_b node 1515.

Latch keeper circuitry 1560 may have two serially-connected pfet devices extending between Vcc and dout_b node 1515. Dint node 1525 may additionally be connected to the gate of one of the serially-connected pfet devices of latch keeper circuitry 1560, which may advantageously prevent signal contention from the True NAND output when parallel pull-down device 1530 discharges dout_b node 1515, and may accordingly control a latch keeper path to dout_b node 1515.

Feedback inverter 1550 may be relatively small. To maintain a latching topology, dout_b node 1515 may also connect to an input of feedback inverter 1550, and an output of feedback inverter 1550 may drive an internal "dlat" node 1555. In turn, dlat node 1555 may drive the gate of a third nfet device in the serially-connected nfet devices of true NAND circuitry 1510, and may also drive a gate of one of the serially-connected pfet devices of latch keeper circuitry 1560 along the latch keeper path. (Accordingly, while complement NAND circuitry 1520 may merely have two serially-connected nfets extending between dint node 1525 and ground, true NAND circuitry 1510 may have three serially-connected nfets extending between dout_b node 1515 and ground.)

As a single stacked device, parallel pull-down device 1530 may advantageously have a much greater effective pull-down strength for a given device width than the triple stacked nfet devices of the "true NAND" in the prior design. Furthermore, since parallel pull-down device 1530 functions independently of the serially-connected "stack" of nfet devices in true NAND circuitry 1510, this may advantageously allow true NAND circuitry 1510 to retain a high P-N ratio, which may favor timing for high-to-low transitions.

With respect to the topology of read output circuitry 1500 in FIG. 15, the "complement path" (e.g., corresponding with a low-to-high transition of output data port 1509) may operate as follows. First, one of the complement data-line inputs, such as first complement input 1502, may transition low (e.g., from an activated sense driver). Next, dint node 1525, which is connected to the output node of complement NAND circuitry 1520, may transition from low to high. This may turn off the corresponding pfet of latch keeper circuitry 1560, and may simultaneously turn on parallel pull-down device 1530.

The turning off of the latch keeper path of latch keeper circuitry 1560 may advantageously allow for a relatively quick discharge of dout_b node 1515. The transition of dout_b node 1515 from high to low may in turn cause driver inverter 1540 to transition output data port 1509 from low to high.

In addition, the transition of dout_b node 1515 from high to low may cause feedback inverter 1550 to transition dlat node 1555 from low to high, which may then turn off one of the parallel-connected pfets and turn on one of the serially-connected nfets of true NAND circuitry 1510. Since first true input 1501 and second true input 1506 must be high, the full stack of serially-connected nfets of true NAND circuitry 1510 may be conducting, which may then re-enforce dout_b node 1515 being held low.

As the first complement input 1502 recovers to its high pre-charge state, dint node 1525 may transition from high to low. This may turn on the corresponding pfet device in the latch keeper path of latch keeper circuitry 1560, and may simultaneously turn off parallel pull-down device 1530.

Although parallel pull-down device 1530 might not thereafter maintain dout_b node 1515 low, dout_b node 1515 may be maintained low through serially-connected nfet stack of true NAND circuitry 1510 being on, and the pfet of latch keeper circuitry 1560 corresponding with dlat node 1555 being off (through the feedback latch path loop of dlat node 1555 and dout_b node 1515). Thus, the state of output data port 1509 may be held via a latch path.

An opposing transition on the "true path" (e.g., corresponding with a high-to-low transition of output data port 1509) may operate as follows. One of the true data-line inputs, such as first true input 1501, may transition low. Next, dout_b node 1515, which is connected to the output node of true NAND circuitry 1510, may transition from low to high. The transition of dout_b node 1515 from low to high may in turn cause driver inverter 1540 to transition output data port 1509 from high to low.

In addition, the transition of dout_b node 1515 from low to high may cause feedback inverter 1550 to transition dlat node 1555 from high to low, which may turn off the corresponding serially-connected nfet of true NAND circuitry 1510, and may turn on the corresponding serially-connected pfet of latch keeper circuitry 1560. A discharge path of dout_b node 1515 through stack of serially-connected nfets of true NAND circuitry 1515 may thus be off.

Moreover, with dlat node 1555 low, the latch keeper path to dout_b node 1515 may be turned on. After first true input 1501 recovers to its high pre-charge state, dout_b node 1515 and dlat node 1555 may retain the opposite latched state.

In comparison with the prior design, the structures of read output circuitry 1500 may advantageously support high-to-low transition delays on output data port 1509 that are substantially similar to, or the same as, low-to-high transition delays on output data port 1509. Moreover, these nearly-identical high-to-low and low-to-high transition delays may be maintained across various PVT conditions, and across various configurations of the multi-block SRAM array topology.

In addition, the high-to-low transition delays and low-to-high transition delays may advantageously both be faster than in prior designs having larger devices to promote greater balance between high-to-low transitions and low-to-high transitions. These improved delays may be largely maintained across various PVT conditions.

Furthermore, the structures of read output circuitry 1500 may advantageously improve power consumption factors, such as leakage current and total switching charge. Area used by the structures of read output circuitry 1500 may also be competitive with area used by the structures of the previous design.

The read output latch circuitries described herein may be suitable for SRAM array topologies with a butterfly architecture, in which data may be received from separate signal lines of opposing physical sides. Such architectures may provide for high performance timing by reducing RC loading of input data-lines. However, for compiler configurations that are reduced to array blocks on only one side of the memory, read output latch circuitries described herein may still be used by simply tying off the unused data-signal side to logic high.

With respect to a variety of embodiments of the structures of FIG. 15, an apparatus may comprise a first circuitry (e.g., true NAND circuitry 1510), a second circuitry (e.g., complement NAND circuitry 1520), a third circuitry (e.g., parallel pull-down device 1530), a read-data input (e.g., first true input 1501), and an inverse-read-data input (e.g., first complement input 1502). The first circuitry and second circuitry may each have a NAND gate and a VCC node, a ground node, a plurality of input nodes, an output node, a plurality of p-channel transistors coupled in parallel between the VCC node and the output node, and a plurality of n-channel transistors coupled in series between the output node and the ground node. The read-data input may be connected to a first input node of the first circuitry, and the inverse-read-data input may be connected to a first input node of the second circuitry. The third circuitry may have an n-channel transistor with a source terminal connected to ground, a gate terminal connected to the output node of the second circuitry, and a drain terminal connected to the output node of the first circuitry.

In some embodiments, the apparatus may comprise a fourth circuitry (e.g., driver inverter 1540) having an inverter gate with an input node connected to the output node of the first circuitry, and an output node connected to a data output.

For some embodiments, the apparatus may comprise a fifth circuitry (e.g., feedback inverter 1550) having an inverter gate with an input node connected to the drain terminal of the n-channel transistor of the third circuitry, and an output node connected at least to one of the n-channel transistors of the first circuitry. In some embodiments, the apparatus may comprise a sixth circuitry (e.g., latch keeper circuitry 1560) having a plurality of p-channel transistors coupled in series between a VCC node and a node connected to the output node of the first circuitry, the plurality of p-channel transistors including at least a first p-channel transistor and a second p-channel transistor. A gate of the first p-channel transistor of the sixth circuitry may be connected to the output node of the second circuitry, and a gate of the second p-channel transistor of the sixth circuitry may be connected to the output node of the fifth circuitry.

In some embodiments, the apparatus may comprise a keeper circuitry (e.g., first keeper circuitry 1503) having a first p-channel transistor and a second p-channel transistor. The first p-channel transistor may have a drain terminal coupled to the read-data input, a source terminal coupled to a VCC node, and gate terminal coupled to the inverse-read-data input, and the second p-channel transistor may have a drain terminal coupled to the inverse-read-data input, a source terminal coupled to a VCC node, and a gate terminal coupled to the read-data input.

For some embodiments, the read-data input may be a first read-data input, and the inverse-read-data input may be a first inverse-read-data input. The apparatus may comprise a second read-data input (e.g., second true input 1506) connected to a second input node of the first circuitry, and a second inverse-read-data input (e.g., second complement input 1507) connected to a second input node of the second circuitry.

In some embodiments, the keeper circuitry may be s a first keeper circuitry. The apparatus may comprise a second keeper circuitry (e.g., second keeper circuitry 1508) having a first p-channel transistor and a second p-channel transistor. The first p-channel transistor may have a source terminal coupled to the second read-data input, a drain terminal coupled to a VCC node, and gate terminal coupled to the second inverse-read-data input, and the second p-channel transistor may have a source terminal coupled to the second inverse-read-data input, a drain terminal coupled to a VCC node, and a gate terminal coupled to the second read-data input.

For some embodiments, at least one of the first circuitry and the second circuitry may include an evaluation-phase NAND gate. In some embodiments, the first circuitry may be at least a portion of a true read-data path, and the second circuitry may be at least a portion of complement read-data path.

Alternatively, with respect to a variety of embodiments of the structures of FIG. 15, an apparatus may comprise a first NAND circuitry (e.g., true NAND circuitry 1510), a second NAND circuitry (e.g., complement NAND circuitry 1520), a pull-down circuitry (e.g., parallel pull-down circuitry 1530), and an inverter circuitry (e.g., driver inverter 1540), a first read-data input (e.g., first true input 1501), and a second read-data input (e.g., second true input 1506). The first NAND circuitry may have at least a first input node, a second input node, and an output node. The second NAND circuitry may have at least a first input node, a second input node, and an output node. The first read-data input may be connected to the first input node of the first NAND circuitry, and the second read-data input may be connected to the second input node of the first NAND circuitry. The pull-down circuitry may have an n-channel transistor with a source terminal connected to ground, a gate terminal connected to the output node of the second NAND circuitry, and a drain terminal connected to the output node of the first NAND circuitry. The inverter circuitry may have an input node connected to the output node of the first NAND circuitry, and an output node connected to a data output.

In some embodiments, the first NAND circuitry and/or the second NAND circuitry may include an evaluation-phase NAND gate. For some embodiments, the inverter circuitry may be a first inverter circuitry, and the first NAND circuitry may have a plurality of pull-down n-channel transistors. The apparatus may comprise a second inverter circuitry (e.g., feedback inverter 1550) having an input node connected to the drain terminal of the n-channel transistor of the pull-down circuitry, and an output node connected to a gate terminal of a pull-down n-channel transistor of the first NAND circuitry.

For some embodiments, the latch keeper circuitry may have a plurality of p-channel transistors coupled in series between a VCC node and a node connected to the output node of the first NAND circuitry, the plurality of p-channel transistors including at least a first p-channel transistor and a second p-channel transistor. A gate of the first p-channel transistor may be connected to the output node of the second NAND circuitry, and a gate of the second p-channel transistor may be connected to the output node of the second inverter circuitry.

In some embodiments, the apparatus may comprise a first inverse-read-data input (e.g., first complement input 1502) connected to the first input node of the second NAND circuitry, and a second inverse-read-data input (e.g., second complement input 1507) connected to the second input node of the second NAND circuitry.

For some embodiments, the apparatus may comprise a read-data keeper circuitry (e.g., first keeper circuitry 1503) having a first p-channel transistor and a second p-channel transistor. The first p-channel transistor may have a drain terminal coupled to the first read-data input, a source terminal coupled to a VCC node, and gate terminal coupled to the first inverse-read-data input, and the second p-channel transistor may have a drain terminal coupled to the first inverse-read-data input, a source terminal coupled to a VCC node, and a gate terminal coupled to the first read-data input.

In some embodiments, the read-data keeper circuitry may be a first read-data keeper circuitry. The apparatus may comprise a second read-data keeper circuitry (e.g., second keeper circuitry 1508) having a first p-channel transistor and a second p-channel transistor. The first p-channel transistor may have a source terminal coupled to the second read-data input, a drain terminal coupled to a VCC node, and gate terminal coupled to the second inverse-read-data input, and the second p-channel transistor may have a source terminal coupled to the second inverse-read-data input, a drain terminal coupled to a VCC node, and a gate terminal coupled to the second read-data input.

For some embodiments, the first NAND circuitry may be at least a portion of a true read-data path, and the second NAND circuitry may be at least a portion of complement read-data path.

Figure 16:
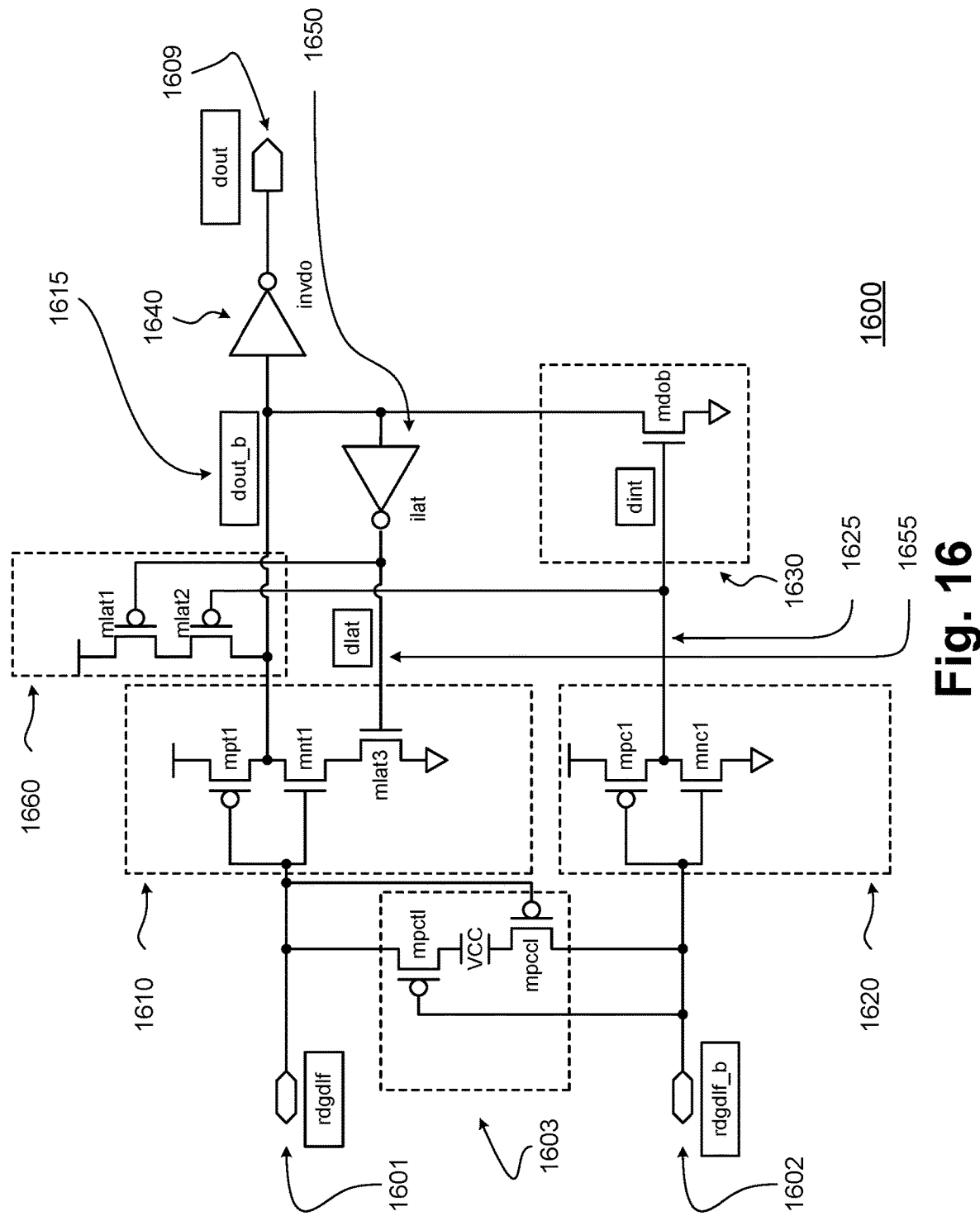
FIG. 16 illustrates a read output circuitry for one-sided configurations, in accordance with some embodiments of the disclosure.
Figure 17:
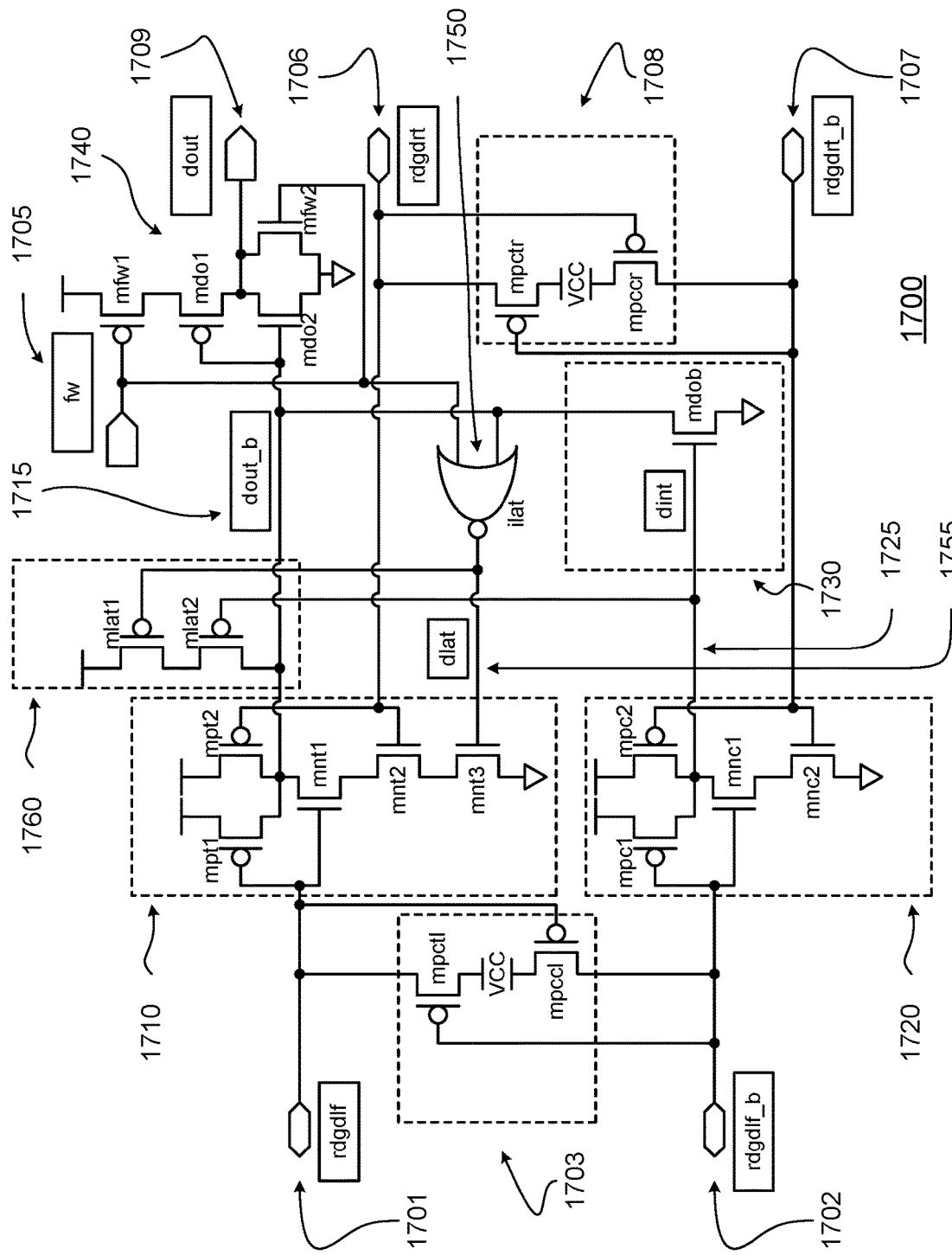
FIG. 17 illustrates a read output circuitry incorporating output firewall functionality, in accordance with some embodiments of the disclosure.

In some embodiments, the mechanisms and methods disclosed herein may be applied to various different configurations. FIG. 16 illustrates a read output circuitry for one-sided configurations, in accordance with some embodiments of the disclosure, and FIG. 17 illustrates a read output circuitry incorporating output firewall functionality, in accordance with some embodiments of the disclosure.

With respect to FIG. 16, a read output circuitry 1600 may be substantially similar to read output circuitry 1500. In comparison with read output circuitry 1500, read output circuitry 1600 has mechanisms directed merely to a single true input and a single complement input.

In various embodiments, read output circuitry 1600 may comprise two read data signal lines: a true input 1601 and a complement input 1602 corresponding with an SRAM memory array topology. Read output circuitry 1600 may also comprise a keeper circuitry 1603 which may include cross-coupled pfet devices on the true-complement data-line pairs.

Read output circuitry 1600 may comprise a true NAND circuitry 1610 and a complement NAND circuitry 1620. True input 1601 may be connected to gates of a pfet/nfet pair of true NAND circuitry 1610, while complement input 1602 may be connected to gates of a pfet/nfet pair of complement NAND circuitry 1620. Also, the output node of true NAND circuitry 1610, an internal "dout_b" node 1615, may be connected to the input of a driver inverter 1640, which may then drive read data to an output data port 1609.

Read output circuitry 1600 may comprise a parallel pull-down device 1630, a feedback inverter 1650 (e.g., "ilat"), and a latch keeper circuitry 1660. Parallel pull-down device 1630 may be an nfet device extending between dout_b node 1615 and ground. The output node of complement NAND circuitry 1620, which may be an internal "dint" node 1625, may be connected to the gate of parallel pull-down device 1630. When turned on (e.g., when dint node 1625 has a value of "1"), parallel pull-down device 1630 may be dedicated to discharging dout_b node 1615.

Latch keeper circuitry 1660 may have two serially-connected pfet devices extending between Vcc and dout_b node 1615. Dint node 1625 may additionally be connected to the gate of one of the serially-connected pfet devices of latch keeper circuitry 1660, which may advantageously prevent signal contention from the True NAND output when parallel pull-down device 1630 discharges dout_b node 1615, and may accordingly control a latch keeper path to dout_b node 1615.

Feedback inverter 1650 may be relatively small. To maintain a latching topology, dout_b node 1615 may also connect to an input of feedback inverter 1650, and an output of feedback inverter 1650 may drive an internal "dlat" node 1655. In turn, dlat node 1655 may drive the gate of a third nfet device in the serially-connected nfet devices of true NAND circuitry 1610, and may also drive a gate of one of the serially-connected pfet devices of latch keeper circuitry 1660 along the latch keeper path. (Accordingly, while complement NAND circuitry 1620 may merely have one nfet extending between dint node 1625 and ground, true NAND circuitry 1610 may have two serially-connected nfets extending between dout_b node 1615 and ground.)

Read output circuitry 1500 and/or read output circuitry 1600 may be suitable reasonable for a compiler with a wide memory range that includes both single-block and multiple-block configurations. In this manner, a common output circuit may be used to support a wide variety of compiler configuration combinations.

However, if a read output circuitry is to be implemented on a memory product that only supports array data from one physical side, the circuitry may be reduced by simply removing all device elements connected to the unneeded true/complement read data signal line pair, as depicted for example in FIG. 16. As shown, the input NAND structures may be reduced to inverters. Such configurations may advantageously facilitate an area reduction for the read output circuitry.

The read output latch circuitries described herein may be core functional circuitries. However, products developed using the circuitries might be targeted to incorporate "firewall" features on the data port, which may be used to cut off the internal power supply to the periphery circuits of the memory as a means to reduce leakage currents during various power-reduction modes and power-up conditions. In addition to clamping the output data port low, it may be desirable for the output data state to be latched to a low level (i.e., a logical 0 level) when the supply voltage is restored.

With respect to FIG. 17, a read output circuitry 1700 may be substantially similar to read output circuitry 1500. In comparison with read output circuitry 1500, read output circuitry 1700 has mechanisms directed toward.

Read output circuitry 1700 may comprise four read data signal lines: a first true input 1701 and a first complement input 1702 corresponding with a first side of an SRAM memory array topology, and a second true input 1706 and a second complement input 1707 corresponding with a second side of the SRAM memory array topology. Read output circuitry 1700 may additionally comprise a first keeper circuitry 1703 and a second keeper circuitry 1708, which may comprise cross-coupled pfet devices on the true-complement data-line pairs.

Read output circuitry 1700 may comprise a true NAND circuitry 1710 and a complement NAND circuitry 1720. Each of first true input 1701 and second true input 1706 may be connected to gates of a pfet/nfet pair of true NAND circuitry 1710, while each of first complement input 1702 and second complement input 1707 may be connected to gates of a pfet/nfet pair of complement NAND circuitry 1720. Also, the output node of true NAND circuitry 1710, an internal "dout_b" node 1715, may be connected to gates of a pfet/nfet pair of a driver NAND gate 1740, which may then drive read data to an output data port 1709.

Read output circuitry 1700 may comprise a parallel pull-down device 1730, a feedback NOR gate 1750 (e.g., "ilat"), and a latch keeper circuitry 1760. Parallel pull-down device 1730 may be an nfet device extending between dout_b node 1715 and ground. The output node of complement NAND circuitry 1720, which may be an internal "dint" node 1725, may be connected to the gate of parallel pull-down device 1730. When turned on (e.g., when dint node 1725 has a value of "1"), parallel pull-down device 1730 may be dedicated to discharging dout_b node 1715.

Latch keeper circuitry 1760 may have two serially-connected pfet devices extending between Vcc and dout_b node 1715. Dint node 1725 may additionally be connected to the gate of one of the serially-connected pfet devices of latch keeper circuitry 1760, which may advantageously prevent signal contention from the True NAND output when parallel pull-down device 1730 discharges dout_b node 1715, and may accordingly control a latch keeper path to dout_b node 1715.

To maintain a latching topology, dout_b node 1715 may also connect to an input of feedback NOR gate 1750, and an output of feedback NOR gate 1750 may drive an internal "dlat" node 1755. In turn, dlat node 1755 may drive the gate of a third nfet device in the serially-connected nfet devices of true NAND circuitry 1710, and may also drive a gate of one of the serially-connected pfet devices of latch keeper circuitry 1760 along the latch keeper path. (Accordingly, while complement NAND circuitry 1720 may merely have two serially-connected nfets extending between dint node 1725 and ground, true NAND circuitry 1710 may have three serially-connected nfets extending between dout_b node 1715 and ground.)

Read output circuitry 1700 may also have a firewall-enable input 1705 that may be connected to gates of a pfet/nfet pair of driver NAND gate 1740. Firewall-enable input 1705 may also connect to an input of feedback NOR gate 1750.

Accordingly, a read output circuitry may be modified for configurations enabling firewall features. The final driver stage (e.g. driver NAND gate 1740) may be converted from an inverter to a NOR gate, with a secondary input being firewall-enable input 1705. To retain the switching drive strengths of the original output inverter, the additional pfet device of the final driver stage, which may be gated by firewall-enable input 1705, may have a larger width than the serially-connected pfet to which dout_b node 1715 is coupled. In contrast, the additional nfet pulldown device of the final driver stage may be nearly minimal size, to simply maintain a low logic state during a firewall mode (e.g., when firewall-enable input 1705 is high).

In addition to the modifications to driver NAND gate 1740, the original feedback inverter may accordingly be converted to a NOR gate with firewall-enable input 1705 as the secondary input (e.g., feedback NOR gate 1750). This logic change may promote the maintenance of a low-latched data state when firewall-enable input 1705 is de-asserted (e.g., transitions from high to low).

The firewall feature may also advantageously initialize a known output state (e.g., a low level, or a data logic state of '0') upon power-up. Since the latch path may not be a critical speed path, all the devices of the NOR latch may be minimally sized devices.

Figure 18A:
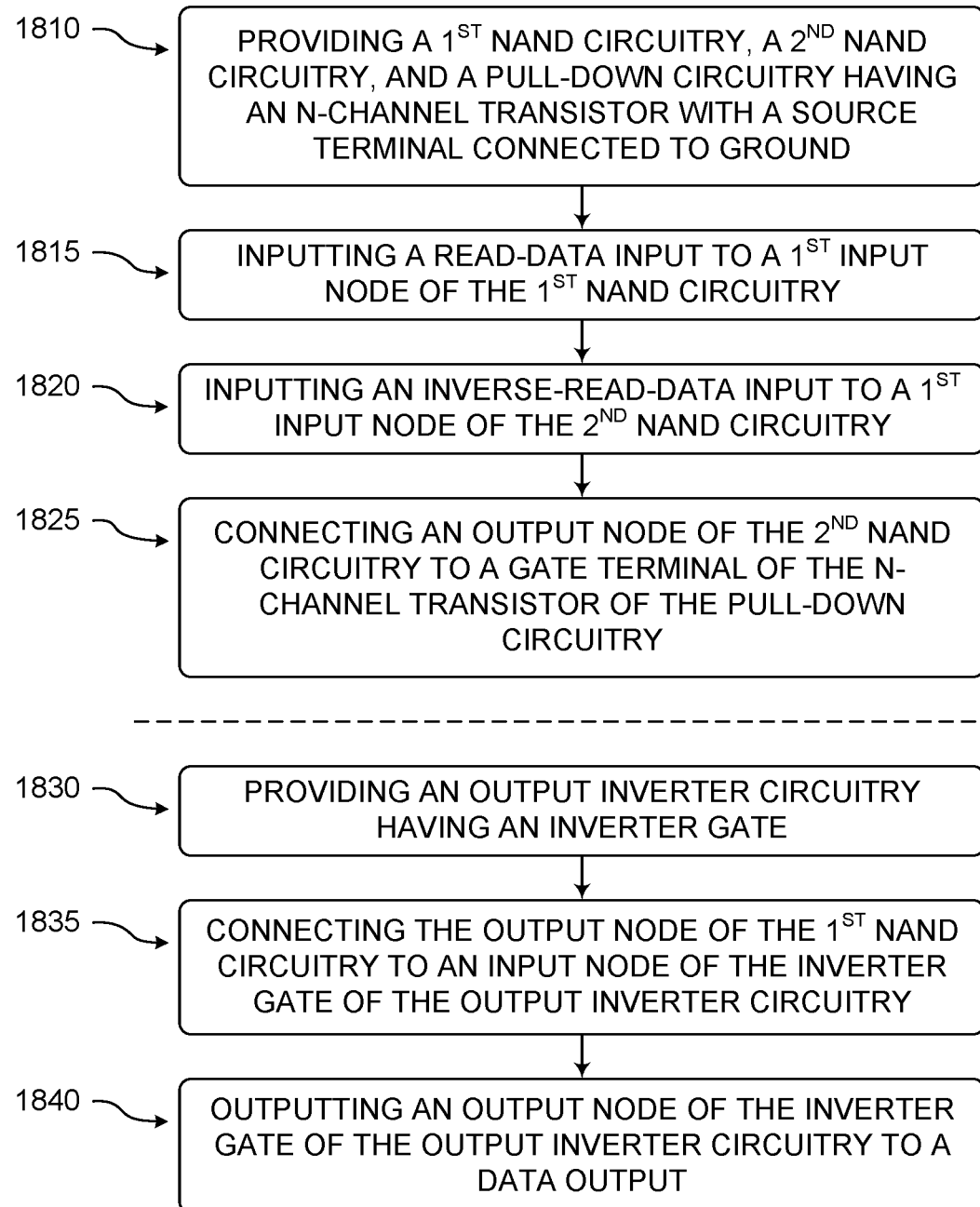
FIGS. 18A-18B illustrate methods for improving sense-to-data-out performance of a read data-path for SRAM memories, in accordance with some embodiments of the disclosure.
Figure 18B:
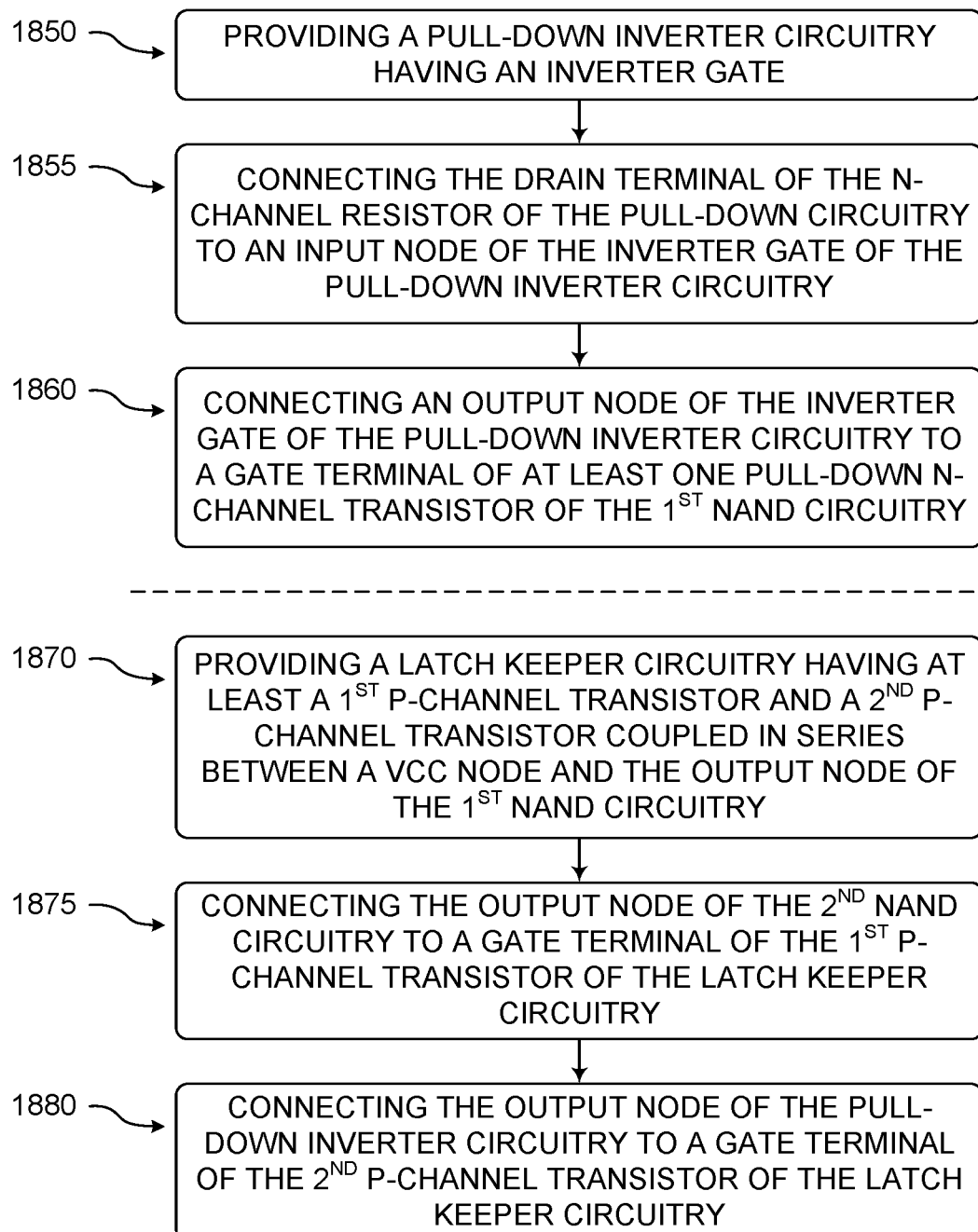

FIGS. 18A-18B illustrates methods for improving sense-to-data-out performance of a read data-path for SRAM memories, in accordance with some embodiments of the disclosure. A method 1800 may comprise a block 1810, a block 1815, a block 1820, and a block 1825. In block 1810, a first NAND circuitry, a second NAND circuitry, and a pull-down circuitry having an n-channel transistor with a source terminal connected to ground may be provided. In block 1815, a read-data input to a first input node of the first NAND circuitry may be inputted. In block 1820, an inverse-read-data input to a first input node of the second NAND circuitry may be inputted. In block 1825, an output node of the second NAND circuitry may be connected to a gate terminal of the n-channel transistor of the pull-down circuitry. IN block 1830, an output node of the first NAND circuitry may be connected to a drain terminal of the n-channel transistor.

In some embodiments, method 1800 may also comprise a block 1830, a block 1835, and/or a block 1840. In block 1830, an output inverter circuitry having an inverter gate may be provided. In block 1835, the output node of the first NAND circuitry may be connected to an input node of the inverter gate of the output inverter circuitry. In block 1840, an output node of the inverter gate of the output inverter circuitry may be outputted to a data output.

In some embodiments, method 1800 may also comprise a block 1850, a block 1855, and/or a block 1860. In block 1850, a pull-down inverter circuitry having an inverter gate may be provided. In block 1855, the drain terminal of the n-channel resistor of the pull-down circuitry may be connected to an input node of the inverter gate of the pull-down inverter circuitry. In block 1860, an output node of the inverter gate of the pull-down inverter circuitry may be connected to a gate terminal of at least one pull-down n-channel transistor of the first NAND circuitry.

In some embodiments, method 1800 may also comprise a block 1870, a block 1875, and/or a block 1880. In block 1870, a latch keeper circuitry having at least a first p-channel transistor and a second p-channel transistor coupled in series between a VCC node and the output node of the first NAND circuitry may be provided. In block 1875, the output node of the second NAND circuitry may be connected to a gate terminal of the first p-channel transistor of the latch keeper circuitry. In block 1880, the output node of the pull-down inverter circuitry may be connected to a gate terminal of the second p-channel transistor of the latch keeper circuitry.

Although the blocks in the flowchart with reference to FIGS. 18A-18B are shown in a particular order, the order of the blocks can be modified. Thus, the illustrated embodiments can be performed in a different order, and some blocks may be performed in parallel. Some of the blocks and/or operations listed in FIGS. 18A-18B are optional in accordance with certain embodiments. The numbering of the blocks presented is for the sake of clarity and is not intended to prescribe an order of operations in which the various blocks must occur. Additionally, operations from the various flows may be utilized in a variety of combinations.

In some embodiments, an apparatus may comprise means for performing various blocks and/or operations of the methods of FIGS. 18A-18B.

Moreover, in some embodiments, machine readable storage media may have executable instructions that, when executed, cause one or more processors to perform an operation comprising a method of FIGS. 18A-18B. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

Figure 19:
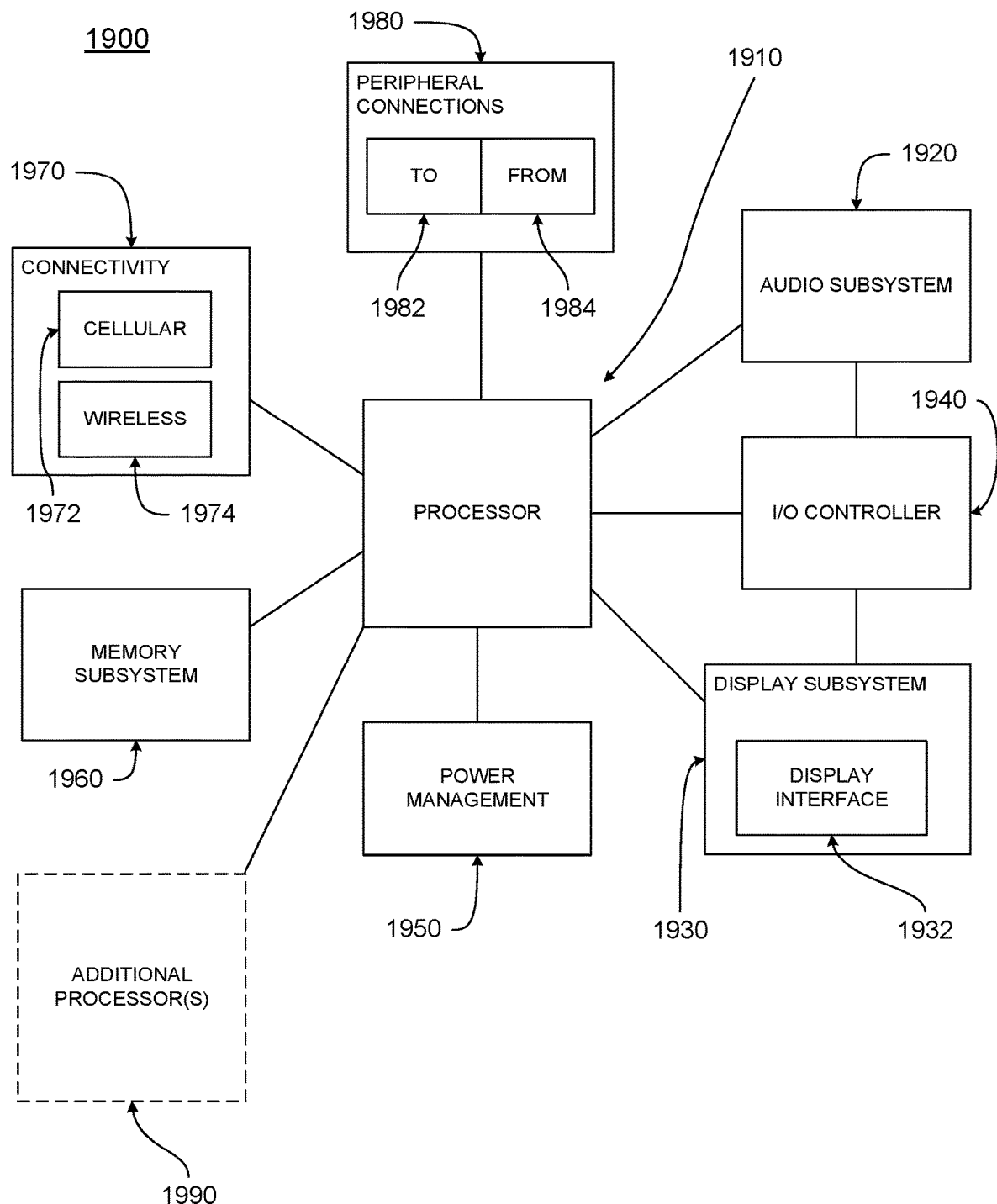
FIG. 19 illustrates a computing device with mechanisms for implementing multiplexing and latching of output read-data in an SRAM array and/or improving sense-to-data-out performance of a read data-path for SRAM memories, in accordance with some embodiments of the disclosure.

FIG. 19 illustrates a computing device with mechanisms for implementing multiplexing and latching of output read-data in an SRAM array and/or improving sense-to-data-out performance of a read data-path for SRAM memories, in accordance with some embodiments of the disclosure. Computing device 1900 may be a computer system, a System-on-a-Chip (SoC), a tablet, a mobile device, a smart device, or a smart phone with mechanisms for implementing multiplexing and latching of output read-data in an SRAM array and/or improving sense-to-data-out performance of a read data-path for SRAM memories, in accordance with some embodiments of the disclosure. It will be understood that certain components of computing device 1900 are shown generally, and not all components of such a device are shown FIG. 19. Moreover, while some of the components may be physically separate, others may be integrated within the same physical package, or even on the same physical silicon die. Accordingly, the separation between the various components as depicted in FIG. 19 may not be physical in some cases, but may instead be a functional separation. It is also pointed out that those elements of FIG. 19 having the same names or reference numbers as the elements of any other figure can operate or function in any manner similar to that described, but are not limited to such.

In various embodiments, the components of computing device 1900 may include any of a processor 1910, an audio subsystem 1920, a display subsystem 1930, an I/O controller 1940, a power management component 1950, a memory subsystem 1960, a connectivity component 1970, one or more peripheral connections 1980, and one or more additional processors 1990. In some embodiments, processor 1910 may include mechanisms for implementing multiplexing and latching of output read-data in an SRAM array and/or improving sense-to-data-out performance of a read data-path for SRAM memories, in accordance with some embodiments of the disclosure. In various embodiments, however, any of the components of computing device 1900 may include the mechanisms for implementing multiplexing and latching of output read-data in an SRAM array and/or improving sense-to-data-out performance of a read data-path for SRAM memories, in accordance with some embodiments of the disclosure. In addition, one or more components of computing device 1900 may include an interconnect fabric having a plurality of ports, such as a router, a network of routers, or a Network-on-a-Chip (NoC).

In some embodiments, computing device 1900 may be a mobile device which may be operable to use flat surface interface connectors. In one embodiment, computing device 1900 may be a mobile computing device, such as a computing tablet, a mobile phone or smart-phone, a wireless-enabled e-reader, or other wireless mobile device. The various embodiments of the present disclosure may also comprise a network interface within 1970 such as a wireless interface so that a system embodiment may be incorporated into a wireless device, for example a cell phone or personal digital assistant.

Processor 1910 may be a general-purpose processor or CPU (Central Processing Unit). In some embodiments, processor 1910 may include one or more physical devices, such as microprocessors, application processors, microcontrollers, programmable logic devices, or other processing means. The processing operations performed by processor 1910 may include the execution of an operating platform or operating system on which applications and/or device functions may then be executed. The processing operations may also include operations related to one or more of the following: audio I/O; display I/O; power management; connecting computing device 1900 to another device; and/or I/O (input/output) with a human user or with other devices.

Audio subsystem 1920 may include hardware components (e.g., audio hardware and audio circuits) and software components (e.g., drivers and/or codecs) associated with providing audio functions to computing device 1900. Audio functions can include speaker and/or headphone output as well as microphone input. Devices for such functions can be integrated into computing device 1900, or connected to computing device 1900. In one embodiment, a user interacts with computing device 1900 by providing audio commands that are received and processed by processor 1910.

Display subsystem 1930 may include hardware components (e.g., display devices) and software components (e.g., drivers) that provide a visual and/or tactile display for a user to interact with computing device 1900. Display subsystem 1930 may include a display interface 1932, which may be a particular screen or hardware device used to provide a display to a user. In one embodiment, display interface 1932 includes logic separate from processor 1910 to perform at least some processing related to the display. In some embodiments, display subsystem 1930 includes a touch screen (or touch pad) device that provides both output and input to a user.

I/O controller 1940 may include hardware devices and software components related to interaction with a user. I/O controller 1940 may be operable to manage hardware that is part of audio subsystem 1920 and/or display subsystem 1930. Additionally, I/O controller 1940 may be a connection point for additional devices that connect to computing device 1900, through which a user might interact with the system. For example, devices that can be attached to computing device 1900 might include microphone devices, speaker or stereo systems, video systems or other display devices, keyboard or keypad devices, or other I/O devices for use with specific applications such as card readers or other devices.

As mentioned above, I/O controller 1940 can interact with audio subsystem 1920 and/or display subsystem 1930. For example, input through a microphone or other audio device can provide input or commands for one or more applications or functions of computing device 1900. Additionally, audio output can be provided instead of, or in addition to, display output. In another example, if display subsystem 1930 includes a touch screen, the display device may also act as an input device, which can be at least partially managed by I/O controller 1940. There can also be additional buttons or switches on computing device 1900 to provide I/O functions managed by I/O controller 1940.

In some embodiments, I/O controller 1940 manages devices such as accelerometers, cameras, light sensors or other environmental sensors, or other hardware that can be included in computing device 1900. The input can be part of direct user interaction, and may provide environmental input to the system to influence its operations (such as filtering for noise, adjusting displays for brightness detection, applying a flash for a camera, or other features).

Power management component 1950 may include hardware components (e.g., power management devices and/or circuitry) and software components (e.g., drivers and/or firmware) associated with managing battery power usage, battery charging, and features related to power saving operation.

Memory subsystem 1960 may include one or more memory devices for storing information in computing device 1900. Memory subsystem 1960 can include nonvolatile memory devices (whose state does not change if power to the memory device is interrupted) and/or volatile memory devices (whose state is indeterminate if power to the memory device is interrupted). Memory subsystem 1960 can store application data, user data, music, photos, documents, or other data, as well as system data (whether long-term or temporary) related to the execution of the applications and functions of computing device 1900.

Some portion of memory subsystem 1960 may also be provided as a non-transitory machine-readable medium for storing the computer-executable instructions (e.g., instructions to implement any other processes discussed herein). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity component 1970 may include a network interface, such as a cellular interface 1972 or a wireless interface 1974 (so that an embodiment of computing device 1900 may be incorporated into a wireless device such as a cellular phone or a personal digital assistant). In some embodiments, connectivity component 1970 includes hardware devices (e.g., wireless and/or wired connectors and communication hardware) and software components (e.g., drivers and/or protocol stacks) to enable computing device 1900 to communicate with external devices. Computing device 1900 could include separate devices, such as other computing devices, wireless access points or base stations, as well as peripherals such as headsets, printers, or other devices.

In some embodiments, connectivity component 1970 can include multiple different types of network interfaces, such as one or more wireless interfaces for allowing processor 1910 to communicate with another device. To generalize, computing device 1900 is illustrated with cellular interface 1972 and wireless interface 1974. Cellular interface 1972 refers generally to wireless interfaces to cellular networks provided by cellular network carriers, such as provided via GSM or variations or derivatives, CDMA (code division multiple access) or variations or derivatives, TDM (time division multiplexing) or variations or derivatives, or other cellular service standards. Wireless interface 1974 refers generally to non-cellular wireless interfaces, and can include personal area networks (such as Bluetooth, Near Field, etc.), local area networks (such as Wi-Fi), and/or wide area networks (such as WiMax), or other wireless communication.

Peripheral connections 1980 may include hardware interfaces and connectors, as well as software components (e.g., drivers and/or protocol stacks) to make peripheral connections. It will be understood that computing device 1900 could both be a peripheral device to other computing devices (via "to" 1982), as well as have peripheral devices connected to it (via "from" 1984). The computing device 1900 may have a "docking" connector to connect to other computing devices for purposes such as managing content on computing device 1900 (e.g., downloading and/or uploading, changing, synchronizing). Additionally, a docking connector can allow computing device 1900 to connect to certain peripherals that allow computing device 1900 to control content output, for example, to audiovisual or other systems.

In addition to a proprietary docking connector or other proprietary connection hardware, computing device 1900 can make peripheral connections 1980 via common or standards-based connectors. Common types of connectors can include a Universal Serial Bus (USB) connector (which can include any of a number of different hardware interfaces), a DisplayPort or MiniDisplayPort (MDP) connector, a High Definition Multimedia Interface (HDMI) connector, a Firewire connector, or other types of connectors.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 provides an apparatus comprising: a first circuitry having an output coupled to a shared-read-data signal path, and the first circuitry either driving its output to a value based on a sensed memory bit, or not driving its output; a second circuitry having a first clocked inverter and a second clocked inverter cross-coupled with the first clocked inverter, an input of the first clocked inverter being coupled to the shared-read-data signal path, and an output of the first clocked inverter being coupled to an inverse-data signal path; and a third circuitry having an inverter with an input coupled to the inverse-data signal path and an output coupled to a data signal path.

In example 2, the apparatus of example 1, wherein the first clocked inverter has a positive-clock input connected to a first clock signal path and a negative-clock input connected to a second clock signal path; wherein the second clocked inverter has a positive-clock input connected to the second clock signal path and a negative-clock input connected to the first clock signal path; and wherein the second clock signal path is to carry an inverse of a signal carried on the first clock signal path.

In example 3, the apparatus of any of examples 1 through 2, wherein the sensed memory bit is a first sensed memory bit, comprising: an additional circuitry having an output coupled to the shared-read-data signal path, the additional circuitry either driving its output to a value based on a second sensed memory bit, or not driving its output.

In example 4, the apparatus of any of examples 1 through 3, wherein the shared-read-data signal path is a first shared-read-data signal path, comprising: an additional circuitry having a third clocked inverter and a fourth clocked inverter cross-coupled with the third clocked inverter, an input of the third clocked inverter being coupled to a second shared-read-data signal path, and an output of the third clocked inverter being coupled to the inverse-data signal path.

In example 5, the apparatus of example 4, wherein the third clocked inverter has a positive-clock input connected to a third clock signal path and a negative-clock input connected to a fourth clock signal path; wherein the fourth clocked inverter has a positive-clock input connected to the fourth clock signal path and a negative-clock input connected to the third clock signal path; and wherein the fourth clock signal path carries an inverse of a signal carried on the third clock signal path.

In example 6, the apparatus of example 5, wherein the first clock signal path and the third clock signal path are independently driven.

In example 7, the apparatus of any of examples 5 through 6, comprising: a clock circuitry having a first output carrying an OR of the first clock signal path and the third clock signal path, and a second output carrying an inverse of the first output.

In example 8, the apparatus of example 7, comprising: a clocked latching circuitry having a data input connected to the inverse-data signal path, a data output connected to the inverse-data signal path, a positive-clock input connected to the second output of the clock circuitry, and a negative-clock input connected to the first output of the clock circuitry.

Example 9 provides an apparatus comprising: a driver circuitry having a sense amplifier and an output coupled to a shared-read-data signal path, the driver circuitry to either drive its output to a value of a sensed memory bit during a read operation of its sense amplifier, or not drive its output during a standby mode of its sense amplifier; a receiver-and-keeper circuitry having cross-coupled clocked inverters, one of the clocked inverters having an input coupled to the shared-read-data signal path and an output coupled to an inverse-data signal path; and an inverter having an input coupled to the inverse-data signal data path and an output coupled to a data signal path.

In example 10, the apparatus of example 9, wherein a first clocked inverter of the receiver-and-keeper circuitry has a positive-clock input connected to a first clock signal path and a negative-clock input connected to a second clock signal path; wherein a second clocked inverter of the receiver-and-keeper circuitry has a positive-clock input connected to the second clock signal path and a negative-clock input connected to the first clock signal path; and wherein the second clock signal path carries an inverse of a signal carried on the first clock signal path.

In example 11, the apparatus of any of examples 9 through 10, wherein the driver circuitry is a first driver circuitry, and wherein the sensed memory bit is a first sensed memory bit, comprising: a second driver circuitry having a sense amplifier and an output coupled to the shared-read-data signal path, the second driver circuitry to either drive its output to a value of a second sensed memory bit during a read operation of its sense amplifier, or not drive its output during a standby mode of its sense amplifier.

In example 12, the apparatus of any of examples 9 through 11, wherein the shared-read-data signal path is a first shared-read-data signal path, and wherein the receiver-and-keeper circuitry is a first receiver-and-keeper circuitry, comprising: a second receiver-and-keeper circuitry having cross-coupled clocked inverters, one of the clocked inverters having an input coupled to a second shared-read-data signal path and an output coupled to the inverse-data signal path.

In example 13, the apparatus of example 12, wherein a first clocked inverter of the second receiver-and-keeper circuitry has a positive-clock input connected to a third clock signal path and a negative-clock input connected to a fourth clock signal path; wherein a second clocked inverter of the second receiver-and-keeper circuitry has a positive-clock input connected to the fourth clock signal path and a negative-clock input connected to the third clock signal path; and wherein the fourth clock signal path carries an inverse of a signal carried on the third clock signal path.

In example 14, the apparatus of example 13, wherein the first clock signal path and the third clock signal path are independently driven.

In example 15, the apparatus of any of examples 13 through 14, comprising: a clock circuitry having a first output carrying an OR of the first clock signal path and the third clock signal path, and a second output carrying an inverse of the first output.

In example 16, the apparatus of example 15, comprising: a clocked latching circuitry having a data input connected to the inverse-data signal path, a data output connected to the inverse-data signal path, a positive-clock input connected to the second output of the clock circuitry, and a negative-clock input connected to the first output of the clock circuitry.

Example 17 provides a system comprising a memory, a processor coupled to the memory, and a wireless interface for allowing the processor to communicate with another device, the processor including: a first circuitry having an output coupled to a shared-read-data signal path, the first circuitry to either drive its output to a value based on a sensed memory bit, or not drive its output; a second circuitry having a first clocked inverter and a second clocked inverter cross-coupled with the first clocked inverter, an input of the first clocked inverter being coupled to the shared-read-data signal path, and an output of the first clocked inverter being coupled to an inverse-data signal path; and a third circuitry having an inverter with an input coupled to the inverse-data signal path and an output coupled to a data signal path.

In example 18, the system of example 17, wherein the first clocked inverter has a positive-clock input connected to a first clock signal path and a negative-clock input connected to a second clock signal path; wherein the second clocked inverter has a positive-clock input connected to the second clock signal path and a negative-clock input connected to the first clock signal path; and wherein the second clock signal path is to carry an inverse of a signal carried on the first clock signal path.

In example 19, the system of any of examples 17 through 18, wherein the sensed memory bit is a first sensed memory bit, comprising: an additional circuitry having an output coupled to the shared-read-data signal path, the additional circuitry to either drive its output to a value based on a second sensed memory bit, or not drive its output.

In example 20, the system of any of examples 17 through 19, wherein the shared-read-data signal path is a first shared-read-data signal path, comprising: an additional circuitry having a third clocked inverter and a fourth clocked inverter cross-coupled with the third clocked inverter, an input of the third clocked inverter being coupled to a second shared-read-data signal path, and an output of the third clocked inverter being coupled to the inverse-data signal path.

Example 21 provides a method comprising: providing, to a shared-read-data signal path, one of: a driven value based on a sensed memory bit, or no driven value; inputting the shared-read-data signal path to a first clocked inverter cross-coupled with a second clocked inverter; outputting from the first clocked inverter to an inverse-data signal path; and inverting the inverse-data signal path to a data signal path.

In example 22, the method of example 21, wherein the sensed memory bit is a first sensed memory bit, comprising: providing, to the shared-read-data signal path, one of: a driven value based on a second sensed memory bit, or no driven value.

In example 23, the method of any of examples 21 through 22, wherein the shared-read-data signal path is a first shared-read-data signal path, comprising: inputting a second shared-read-data signal path to a third clocked inverter cross-coupled with a fourth clocked inverter; and outputting from the third clocked inverter to the inverse-data signal path.

In example 24, the method of example 23, wherein the cross-coupled first clocked inverter and second clocked inverter are driven independently of the cross-coupled third clocked inverter and fourth clocked inverter.

Example 25 provides an apparatus comprising: a first circuitry and a second circuitry, each having a NAND gate and a VCC node, a ground node, a plurality of input nodes, an output node, a plurality of p-channel transistors coupled in parallel between the VCC node and the output node, and a plurality of n-channel transistors coupled in series between the output node and the ground node; a read-data input connected to a first input node of the first circuitry; an inverse-read-data input connected to a first input node of the second circuitry; and a third circuitry having an n-channel transistor with a source terminal connected to ground, a gate terminal connected to the output node of the second circuitry, and a drain terminal connected to the output node of the first circuitry.

In example 26, the apparatus of example 25, comprising: a fourth circuitry having an inverter gate with an input node connected to the output node of the first circuitry, and an output node connected to a data output.

In example 27, the apparatus of example 26, comprising: a fifth circuitry having an inverter gate with an input node connected to the drain terminal of the n-channel transistor of the third circuitry, and an output node connected at least to one of the n-channel transistors of the first circuitry.

In example 28, the apparatus of example 27, comprising: a sixth circuitry having a plurality of p-channel transistors coupled in series between a VCC node and a node connected to the output node of the first circuitry, the plurality of p-channel transistors including at least a first p-channel transistor and a second p-channel transistor, wherein a gate of the first p-channel transistor of the sixth circuitry is connected to the output node of the second circuitry; and wherein a gate of the second p-channel transistor of the sixth circuitry is connected to the output node of the fifth circuitry.

In example 29, the apparatus of any of examples 25 through 28, comprising: a keeper circuitry having a first p-channel transistor and a second p-channel transistor, wherein the first p-channel transistor has a drain terminal coupled to the read-data input, a source terminal coupled to a VCC node, and gate terminal coupled to the inverse-read-data input; and wherein the second p-channel transistor has a drain terminal coupled to the inverse-read-data input, a source terminal coupled to a VCC node, and a gate terminal coupled to the read-data input.

In example 30, the apparatus of example 29, wherein the read-data input is a first read-data input, and wherein the inverse-read-data input is a first inverse-read-data input, comprising: a second read-data input connected to a second input node of the first circuitry; and a second inverse-read-data input connected to a second input node of the second circuitry.

In example 31, the apparatus of example 30, wherein the keeper circuitry is a first keeper circuitry, comprising: a second keeper circuitry having a first p-channel transistor and a second p-channel transistor, wherein the first p-channel transistor has a source terminal coupled to the second read-data input, a drain terminal coupled to a VCC node, and gate terminal coupled to the second inverse-read-data input; and wherein the second p-channel transistor has a source terminal coupled to the second inverse-read-data input, a drain terminal coupled to a VCC node, and a gate terminal coupled to the second read-data input.

In example 32, the apparatus of any of examples 25 through 31, wherein at least one of the first circuitry and the second circuitry includes an evaluation-phase NAND gate.

In example 33, the apparatus of any of examples 25 through 32, wherein the first circuitry is at least a portion of a true read-data path, and the second circuitry is at least a portion of complement read-data path.

Example 34 provides an apparatus comprising: a first NAND circuitry having at least a first input node, a second input node, and an output node; a second NAND circuitry having at least a first input node, a second input node, and an output node; a first read-data input connected to the first input node of the first NAND circuitry; a second read-data input connected to the second input node of the first NAND circuitry; a pull-down circuitry having an n-channel transistor with a source terminal connected to ground, a gate terminal connected to the output node of the second NAND circuitry, and a drain terminal connected to the output node of the first NAND circuitry; and an inverter circuitry having an input node connected to the output node of the first NAND circuitry, and an output node connected to a data output.

In example 35, the apparatus of example 34, wherein at least one of the first NAND circuitry and the second NAND circuitry includes an evaluation-phase NAND gate.

In example 36, the apparatus of any of examples 34 through 35, wherein the inverter circuitry is a first inverter circuitry, and wherein the first NAND circuitry has a plurality of pull-down n-channel transistors, comprising: a second inverter circuitry having an input node connected to the drain terminal of the n-channel transistor of the pull-down circuitry, and an output node connected to a gate terminal of a pull-down n-channel transistor of the first NAND circuitry.

In example 37, the apparatus of example 36, comprising: a latch keeper circuitry having a plurality of p-channel transistors coupled in series between a VCC node and a node connected to the output node of the first NAND circuitry, the plurality of p-channel transistors including at least a first p-channel transistor and a second p-channel transistor, wherein a gate of the first p-channel transistor is connected to the output node of the second NAND circuitry; and wherein a gate of the second p-channel transistor is connected to the output node of the second inverter circuitry.

In example 38, the apparatus of any of examples 34 through 37, comprising: a first inverse-read-data input connected to the first input node of the second NAND circuitry; and a second inverse-read-data input connected to the second input node of the second NAND circuitry.

In example 39, the apparatus of example 38, comprising: a read-data keeper circuitry having a first p-channel transistor and a second p-channel transistor, wherein the first p-channel transistor has a drain terminal coupled to the first read-data input, a source terminal coupled to a VCC node, and gate terminal coupled to the first inverse-read-data input; and wherein the second p-channel transistor has a drain terminal coupled to the first inverse-read-data input, a source terminal coupled to a VCC node, and a gate terminal coupled to the first read-data input.

In example 40, the apparatus of example 39, wherein the read-data keeper circuitry is a first read-data keeper circuitry, comprising: a second read-data keeper circuitry having a first p-channel transistor and a second p-channel transistor, wherein the first p-channel transistor has a source terminal coupled to the second read-data input, a drain terminal coupled to a VCC node, and gate terminal coupled to the second inverse-read-data input; and wherein the second p-channel transistor has a source terminal coupled to the second inverse-read-data input, a drain terminal coupled to a VCC node, and a gate terminal coupled to the second read-data input.

In example 41, the apparatus of any of examples 34 through 40, wherein the first NAND circuitry is at least a portion of a true read-data path, and the second NAND circuitry is at least a portion of complement read-data path.

Example 42 provides a system comprising a memory, a processor coupled to the memory, and a wireless interface for allowing the processor to communicate with another device, the processor including: a first circuitry and a second circuitry, each having a NAND gate and a VCC node, a ground node, a plurality of input nodes, an output node, a plurality of p-channel transistors coupled in parallel between the VCC node and the output node, and a plurality of n-channel transistors coupled in series between the output node and the ground node; a read-data input connected to a first input node of the first circuitry; an inverse-read-data input connected to a first input node of the second circuitry; and a third circuitry having an n-channel transistor with a source terminal connected to ground, a gate terminal connected to the output node of the second circuitry, and a drain terminal connected to the output node of the first circuitry.

In example 43, the system of example 42, comprising: a fourth circuitry having an inverter gate with an input node connected to the output node of the first circuitry, and an output node connected to a data output; and a fifth circuitry having an inverter gate with an input node connected to the drain terminal of the n-channel transistor of the third circuitry, and an output node connected at least to one of the n-channel transistors of the first circuitry.

In example 44, the system of example 43, comprising: a sixth circuitry having a plurality of p-channel transistors coupled in series between a VCC node and a node connected to the output node of the first circuitry, the plurality of p-channel transistors including at least a first p-channel transistor and a second p-channel transistor, wherein a gate of the first p-channel transistor of the sixth circuitry is connected to the output node of the second circuitry; and wherein a gate of the second p-channel transistor of the sixth circuitry is connected to the output node of the fifth circuitry.

Example 45 provides a method comprising: providing a first NAND circuitry, a second NAND circuitry, and a pull-down circuitry having an n-channel transistor with a source terminal connected to ground; inputting a read-data input to a first input node of the first NAND circuitry; inputting an inverse-read-data input to a first input node of the second NAND circuitry; connecting an output node of the second NAND circuitry to a gate terminal of the n-channel transistor of the pull-down circuitry; and connecting an output node of the first NAND circuitry to a drain terminal of the n-channel transistor.

In example 46, the method of example 45, comprising: providing an output inverter circuitry having an inverter gate; connecting the output node of the first NAND circuitry to an input node of the inverter gate of the output inverter circuitry; and outputting an output node of the inverter gate of the output inverter circuitry to a data output.

In example 47, the method of any of examples 45 through 46, comprising: providing a pull-down inverter circuitry having an inverter gate; connecting the drain terminal of the n-channel resistor of the pull-down circuitry to an input node of the inverter gate of the pull-down inverter circuitry; and connecting an output node of the inverter gate of the pull-down inverter circuitry to a gate terminal of at least one pull-down n-channel transistor of the first NAND circuitry.

In example 48, the method of example 47, comprising: providing a latch keeper circuitry having at least a first p-channel transistor and a second p-channel transistor coupled in series between a VCC node and the output node of the first NAND circuitry; connecting the output node of the second NAND circuitry to a gate terminal of the first p-channel transistor of the latch keeper circuitry; and connecting the output node of the pull-down inverter circuitry to a gate terminal of the second p-channel transistor of the latch keeper circuitry.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first circuitry and a second circuitry, each having a NAND gate and a power supply node, a ground node, a plurality of input nodes, an output node, a plurality of p-channel transistors coupled in parallel between the power supply node and the output node, and a plurality of n-channel transistors coupled in series between the output node and the ground node;
a read-data input coupled to a first input node of the first circuitry; and
an inverse-read-data input coupled to a first input node of the second circuitry.

2. The apparatus of claim 1, further comprising a third circuitry having an n-channel transistor with a source terminal connected to ground, a gate terminal connected to the output node of the second circuitry, and a drain terminal connected to the output node of the first circuitry.

3. The apparatus of claim 1, further comprising: a keeper circuitry having a first p-channel transistor and a second p-channel transistor, wherein the first p-channel transistor has a drain terminal coupled to the read-data input, a source terminal coupled to the power supply node, and a gate terminal coupled to the inverse-read-data input; and wherein the second p-channel transistor has a drain terminal coupled to the inverse-read-data input, a source terminal coupled to the power supply node, and a gate terminal coupled to the read-data input.

4. The apparatus of claim 1, wherein at least one of the first circuitry and the second circuitry includes an evaluation-phase NAND gate.

5. The apparatus of claim 1, wherein the first circuitry is at least a portion of a true read-data path, and the second circuitry is at least a portion of complementary read-data path.

6. The apparatus of claim 2, further comprising: a fourth circuitry having an inverter gate with an input node connected to the output node of the first circuitry, and an output node connected to a data output.

7. The apparatus of claim 2, further comprising: a fifth circuitry having an inverter gate with an input node connected to the drain terminal of the n-channel transistor of the third circuitry, and an output node connected at least to one of the n-channel transistors of the first circuitry.

8. The apparatus of claim 3, wherein the read-data input is a first read-data input, and wherein the inverse-read-data input is a first inverse-read-data input, comprising: a second read-data input connected to a second input node of the first circuitry; and a second inverse-read-data input connected to a second input node of the second circuitry.

9. The apparatus of claim 7, further comprising: a sixth circuitry having a plurality of p-channel transistors coupled in series between the power supply node and a node connected to the output node of the first circuitry, the plurality of p-channel transistors including at least a first p-channel transistor and a second p-channel transistor, wherein a gate of the first p-channel transistor of the sixth circuitry is connected to the output node of the second circuitry; and wherein a gate of the second p-channel transistor of the sixth circuitry is connected to the output node of the fifth circuitry.

10. The apparatus of claim 8, wherein the keeper circuitry is a first keeper circuitry, and wherein the apparatus further comprises a second keeper circuitry having a first p-channel transistor and a second p-channel transistor, wherein the first p-channel transistor has a source terminal coupled to the second read-data input, a drain terminal coupled to the power supply node, and a gate terminal coupled to the second inverse-read-data input; and wherein the second p-channel transistor has a source terminal coupled to the second inverse-read-data input, a drain terminal coupled to the power supply node, and a gate terminal coupled to the second read-data input.

11. An apparatus comprising:
a first circuitry having an output coupled to a shared-read-data signal path, and the first circuitry either driving its output to a value based on a sensed memory bit, or not driving its output; and
a second circuitry having a first clocked inverter and a second clocked inverter cross-coupled with the first clocked inverter, an input of the first clocked inverter being coupled to the shared-read-data signal path, and an output of the first clocked inverter being coupled to an inverse-data signal path, wherein the first clocked inverter has a positive-clock input coupled to a first clock signal path and a negative-clock input coupled to a second clock signal path.

12. The apparatus of claim 11, further comprising a third circuitry having an inverter with an input coupled to the inverse-data signal path and an output coupled to a data signal path.

13. The apparatus of claim 11, wherein the second clocked inverter has a positive-clock input connected to the second clock signal path and a negative-clock input connected to the first clock signal path.

14. The apparatus of claim 13, wherein the second clock signal path is to carry an inverse of a signal carried on the first clock signal path.

15. A system comprising:
a memory to store one or more instructions;
a processor circuitry coupled to the memory, the processor circuitry to execute the one or more instructions; and
a communication interface to allow the processor circuitry to communicate with another device, wherein the processor circuitry comprises:
a first circuitry and a second circuitry, each having a NAND gate and a power supply node, a ground node, a plurality of input nodes, an output node, a plurality of p-channel transistors coupled in parallel between the power supply node and the output node, and a plurality of n-channel transistors coupled in series between the output node and the ground node;
a read-data input coupled to a first input node of the first circuitry; and
an inverse-read-data input coupled to a first input node of the second circuitry.

16. The system of claim 15, wherein the processor circuitry further comprises a third circuitry having an n-channel transistor with a source terminal connected to ground, a gate terminal connected to the output node of the second circuitry, and a drain terminal connected to the output node of the first circuitry.

17. The system of claim 15, wherein at least one of the first circuitry and the second circuitry includes an evaluation-phase NAND gate.

18. The system of claim 16, wherein the processor circuitry further comprises: a fourth circuitry having an inverter gate with an input node connected to the output node of the first circuitry, and an output node connected to a data output.

19. The system of claim 18, wherein the processor circuitry further comprises: a fifth circuitry having an inverter gate with an input node connected to the drain terminal of the n-channel transistor of the third circuitry, and an output node connected at least to one of the n-channel transistors of the first circuitry.

* * * * *